United States Patent
Tsukude

[19]

[11] Patent Number: 6,038,183
[45] Date of Patent: Mar. 14, 2000

[54] SEMICONDUCTOR MEMORY DEVICE HAVING BURN-IN MODE OPERATION STABLY ACCELERATED

[75] Inventor: Masaki Tsukude, Hyogo, Japan

[73] Assignee: Mitsubishi Denki Kabushiki Kaisha, Tokyo, Japan

[21] Appl. No.: 09/288,019

[22] Filed: Apr. 8, 1999

Related U.S. Application Data

[62] Division of application No. 08/941,215, Sep. 30, 1997.

[30] Foreign Application Priority Data

Mar. 27, 1997 [JP] Japan .................. 9-076162(P)

[51] Int. Cl.⁷ ...................................... G11C 7/00
[52] U.S. Cl. ............... 365/201; 365/230.03; 365/230.06
[58] Field of Search .............. 365/201, 230.01, 365/230.03, 230.06

[56] References Cited

U.S. PATENT DOCUMENTS

| | | | |
|---|---|---|---|
| 5,212,442 | 5/1993 | O'Toole et al. ................. | 365/201 |
| 5,654,925 | 8/1997 | Koh et al. ..................... | 365/201 |
| 5,673,228 | 9/1997 | Timm et al. ................... | 365/201 |
| 5,689,467 | 11/1997 | Hashimoto ..................... | 365/201 |
| 5,694,364 | 12/1997 | Morishita et al. ............. | 365/201 |

FOREIGN PATENT DOCUMENTS

| | | |
|---|---|---|
| 4-225182 | 8/1992 | Japan . |
| 4-258880 | 9/1992 | Japan . |
| 5-159568 | 6/1993 | Japan . |
| 6-68699 | 3/1994 | Japan . |
| 6-76599 | 3/1994 | Japan . |
| 8-170977 | 7/1996 | Japan . |

OTHER PUBLICATIONS

"A 256 DRAM with Simplified Register Control for Low Power Self Refresh and Rapid Burn–in", S. Yoo et al., 1994 Symposium on VLSI Circuits Digest of Technical papers, pp. 85–86.

"Wafer Burn–in (WBI) Technology for RAM's", T. Furuyama et al., 1993 IEEE, pp. 26.5.1–26.5.4.

*Primary Examiner*—David Nelms
*Assistant Examiner*—VanThu Nguyen
*Attorney, Agent, or Firm*—McDermott, Will & Emery

[57] ABSTRACT

Current is reduced in driving a word line in stress acceleration testing such as burn-in, and the time required for the stress acceleration testing is reduced. For an address signal applied from an address buffer, a predetermined internal address signal bit is degenerated and a remaining address signal bit is rendered valid in response to an activation of a stress acceleration mode designation signal to simultaneously drive a desired number of word lines of all word lines to selected state. Any number of word lines can be simultaneously selected and hence current flowing in driving word lines can be reduced in the stress acceleration mode. In the stress acceleration mode of operation, bit line voltage and cell plate voltage are changed, and a current required for driving a plurality of word lines into a selected state is limited.

4 Claims, 15 Drawing Sheets

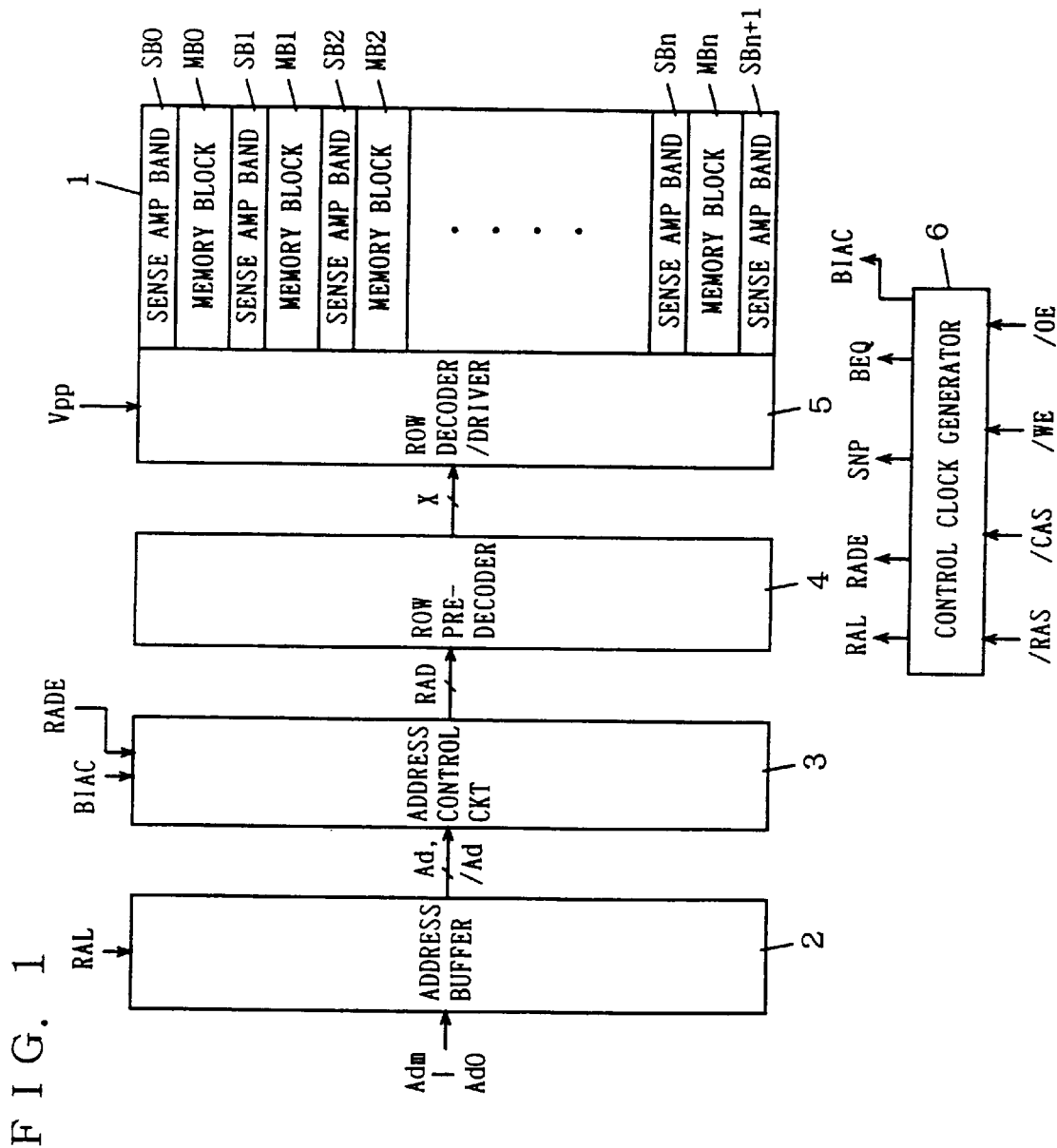
F I G. 1

Ad<m:0> :ALL BITS VALID

Ad<m:i> :VALID
Ad<j:0> :DEGENERATED

SEMICONDUCTOR MEMORY DEVICE HAVING BURN-IN MODE OPERATION STABLY ACCELERATED

This application is a Divisional of application Ser. No. 08/941,215 filed Sep. 30, 1997. Priority of application Ser. No. 9-076162 filed on Mar. 27, 1997, in Japan is claimed under 35 USC 119. The certified priority document(s) were filed in Ser. No. 08/941,215 on Sep. 30, 1997.

BACKGROUND OF THE INVENTION

1. Field of the Invention

The present invention relates to a semiconductor memory device and, in more particular, to a structure for carrying out voltage stress acceleration testing such as burn-in testing. More specifically, the present invention relates to fast and highly reliable voltage stress acceleration testing of dynamic semiconductor memory devices.

2. Description of the Background Art

In manufacturing and then shipping semiconductor memory devices, the semiconductor memory devices are generally screened prior to shipping by revealing latent failures of the semiconductor memory devices, and thus semiconductor devices having the possibility of initial failure are removed to ensure the reliability of the shipped semiconductor memory devices. One of such screening methods is burn-in testing in which high temperature and high voltage are applied to a semiconductor device for operation of the semiconductor device. In the burn-in testing, a semiconductor device is operated with the applied voltage higher than a voltage practically applied and the ambient temperature higher than a temperature practically applied so that the semiconductor device experiences stress greater than that caused during the initial failure period under practical conditions within a short period of time, and any semiconductor devices having the possibility of initial operation failure are selected prior to shipping. Such screening testing efficiently eliminates a semiconductor device having the possibility of initial operation failure and thus improves reliability of products.

In a semiconductor device with large storage capacity, the number of word lines arranged corresponding to rows of memory cells is increased (8K word lines for a 64 M bit DRAM (Dynamic Random Access Memory), for example). When burn-in testing is carried out such that the same number of word lines as in the normal mode of operation are selected in one cycle, address scanning is performed and voltage stress is sequentially applied to the word lines, each word line is only selected once in 8K/n cycles, wherein n represents the number of word lines simultaneously selected in the normal operation mode. This reduces a time period during which voltage stress is applied to each word line. To apply sufficient voltage stress to each word line, word lines need be repeatedly selected and this increases burn-in testing time period.

Furthermore, the increase in number of word lines also increases the time required for burn-in testing.

In order to carry out such burn-in testing at high speed, a method has been proposed in which all word lines are simultaneously selected and direct-current voltage stress is applied to each word line (see Japanese Patent Laying-Open No. 4-225182).

FIG. 25 schematically shows a configuration of a main portion of a conventional semiconductor memory device. In FIG. 25, the conventional semiconductor memory device includes a plurality of memory cells MC arranged in a matrix of a plurality of rows and a plurality of columns, a plurality of word lines WL0–WLn arranged each corresponding to each row of memory cells and each connected to memory cells of a corresponding row, and a plurality of pairs of bit lines arranged each corresponding to each column of memory cells and each connected to memory cells of a corresponding column. FIG. 25 representatively shows one pair of bit lines BL and /BL.

Memory cell MC includes a memory capacitor MQ for storing information, and an access transistor MT formed of an n channel MOS transistor which is turned on in response to a signal potential on a corresponding word line (W0–WLn) to connect memory capacitor MQ to a corresponding bit line (BL or /BL). One elect rode node (a cell plate electrode) of memory capacitor MQ receives a constant cell plate voltage Vcp.

The conventional semiconductor memory device further includes an address buffer AB which buffers an externally applied address signal and generates an internal address signal, a row decoder RD which decodes an internal row address signal applied from address buffer AB to generate a word line select signal for selecting a word line corresponding to an addressed row, and a word line driver WD which responds to the word line select signal from row decoder RD to transfer a boosted voltage Vpp onto the selected word line. The voltage level of boosted voltage Vpp is higher than that of an operating power source voltage.

When a burn-in designation signal φBRN applied via a pad PDa is activated, row decoder RD generates a signal selecting all word lines independently of the logic states of internal address signal bits applied from address buffer AB.

The semiconductor memory device further includes a Vpp generation circuit VPG which generates boosted voltage Vpp, and a switch circuit SWa which selects one of a voltage Ve applied from a pad PDb and a voltage from Vpp generation circuit VPG in response to burn-in mode designation signal φBRN and transfers the selected voltage as boosted voltage Vpp to word line driver WD. Switch circuit SWa selects the voltage from Vpp generation circuit VGP in a mode of operation other than the burn-in (referred to as the normal mode of operation hereinafter), and selects voltage Ve externally applied via pad PDb in the burn-in mode.

The semiconductor memory device further includes a switch circuit SWb which selects one of a predetermined intermediate voltage Vb1 and a ground voltage Vss in response to burn-in mode designation signal φBRN, and a bit line equalizer circuit BEQ provided for each pair of bit lines BL and /BL for transferring a voltage applied from switch circuit SWb to each of bit lines BL and /BL of a corresponding pair of bit lines when bit line equalizer circuit BEQ is activated. Switch circuit SWb selects intermediate voltage Vb1 in the normal mode of operation and ground voltage Vss in the burn-in mode. An operation of the semiconductor memory device shown in FIG. 25 in the burn-in mode will now be described with reference to FIG. 26.

In the burn-in mode, burn-in mode designation signal φBRN applied to pad PDa is activated at high (H) level. In response to the activation of burn-in mode designation signal φBRN, switch circuit SWa selects external voltage Ve applied to pad PDb and applies external voltage Ve to word line driver WD. Switch circuit SWb selects ground voltage Vss instead of intermediate voltage Vb1. Bit line equalizer circuit BEQ is activated via a path (not shown) in response to the activation of burn-in mode designation signal φBRN and holds both bit lines BL and /BL at the ground voltage Vss level.

In this state, row decoder RD is activated in response to activation of a row address strobe signal /RAS (not shown) and performs a decoding operation. In the decoding operation, burn-in mode designation signal φBRN is in an active state and row decoder RD generates a signal selecting all word lines WL0–WLn independently of the logic state of an address signal bit applied from address buffer AB.

In response to the row select signal from row decoder RD, word line driver WD transfers external voltage Ve applied from pad PDb onto word lines WL0–WLn. Word lines WL0–WLn receive external voltage Ve and voltage stress for the gate of access transistor MT of memory cell MC is accelerated. Meanwhile, the potential of each of bit lines BL and /BL is set at low (L) level to also accelerate the voltage stress between the gate and the drain of access transistor MT.

By constantly applying external voltage Ve to word lines WL0–WLn, direct-current voltage stress is applied and voltage stress can be continuously applied to word lines WL0–WLn during the period of the burn-in mode to aim carrying out of efficient burn-in. Furthermore, since all word lines WL0–WLn are simultaneously driven into selected state, the time period required for burn-in is reduced as compared with a case in which word lines are successively selected to receive voltage stress.

When the burn-in mode is completed, word lines WL0–WLn are all driven into non-selected state (in response to inactivation of row address strobe signal /RAS). Then, burn-in mode designation signal φBRN is set at an inactive state of L level and switch circuit SWb is set to select intermediate voltage Vb1. After completion of the operation in the burn-in mode and when the semiconductor memory device is in a standby state, bit line equalizer circuit BEQ is in active state and bit lines BL and /BL are precharged at the intermediate voltage VBL level. Row decoder RD is also set to perform a decoding operation in response to an address signal supplied from address buffer AD.

Since an externally applied voltage is used to transfer a driving voltage to all of word lines in burn-in testing, all of the word lines can be held in selected state without being affected by the driving capability of on-chip Vpp generation circuit VPG. In driving all of the word lines into selected state, however, current is supplied from pad PDb to drive all of the word lines into selected state and large current flow is thus caused. The large current can cause migration of aluminum in a signal line transferring a boosted voltage to word line driver WD and it can disadvantageously cause deterioration of the high voltage transferring line. That is, a defect which has not existed is caused in burn-in testing and a satisfactory semiconductor memory device will be turned into a defective semiconductor memory device.

During the burn-in testing, bit lines BL and /BL receive ground voltage Vss. Meanwhile, cell plate voltage Vcp is maintained at a fixed voltage level. A stress condition accelerating voltage is applied between the gate and the drain of access transistor MT and voltage stress for access transistor MT thus can be accelerated. Meanwhile, ground voltage Vss of bit line BL or /BL is transferred to the other electrode (a storage node) of memory cell capacitor MQ. The level of cell plate voltage Vcp for memory cell capacitor MQ as well as bit line precharging voltage Vb1 is equal to the intermediate voltage level, which is a half of the voltage level of operating power supply voltage Vcc. Thus, the voltage stress for the memory capacitor is also accelerated.

When the voltage stress acceleration condition for the memory cell capacitor is not the same as that for the gate insulating film of the access transistor, reliability evaluation for the capacitor cannot be performed simultaneously with that for the access transistor. Meanwhile, cell plate voltage Vcp is, as is in a normal operation, maintained at a half of power supply voltage Vcc, and the word line driving voltage is set according to externally applied voltage Ve, so that the voltage stress acceleration condition for the memory capacitor cannot be the same as that for the access transistor and thus a reliability evaluation for the memory capacitor requires a voltage stress acceleration testing separated from a reliability evaluation for the access transistor.

SUMMARY OF THE INVENTION

An object of the present invention is to provide a semiconductor memory device which allows fast and stable voltage stress acceleration testing.

Another object of the present invention is to provide a semiconductor memory device which allows voltage stress acceleration for a gate insulating film of an access transistor of a memory cell to be performed simultaneously with that for a dielectric film of a memory cell capacitor.

In a first aspect of the invention, a semiconductor memory device includes: a memory cell array having a plurality of memory cells arranged in a matrix; a plurality of word lines arranged corresponding to respective rows and connected to memory cells of corresponding rows; an address buffer receiving a multi-bit address signal and generating a multi-bit internal address signal; a row selecting portion responsive to an internal address signal from the address buffer for driving that word line of the plurality of word lines which corresponds to an addressed row into selected state; and an address controlling portion responsive to activation of a stress acceleration mode designation signal for setting a predetermined internal address signal bit of an internal address signal into selected state and setting a remaining internal address signal bit into a state corresponding to a state of an applied address signal bit.

In a second aspect of the invention, a semiconductor memory device includes: a plurality of memory cells arranged in a matrix and each including a capacitor for storing information and an access transistor for reading the information stored in the capacitor; a plurality of word lines arranged corresponding to respective rows and connected to memory cells of corresponding rows; a plurality of pairs of bit lines provided corresponding to respective columns and connected to memory cells of corresponding columns; a bit line voltage holding portion provided corresponding to each column for holding each bit line of a corresponding pair of bit lines at a predetermined voltage level when the bit line voltage holding portion is activated; a plurality of sense amplifiers provided corresponding to respective columns for differentially amplifying potentials of respective bit lines of corresponding pairs of bit lines when activated; a bit line voltage supplying portion responsive to activation of a stress acceleration mode destination signal for supplying as a predetermined voltage a reference voltage at a voltage level different from that in the normal mode of operation to the bit line voltage holding portion; a word line selection portion responsive to activation of the stress acceleration mode designation signal for simultaneously driving a predetermined number, more than one of word lines to selected state; a portion for changing the level of a cell plate voltage for a capacitor of each memory cell according to activation of the stress acceleration mode designation signal; and a sense amplifier controlling portion responsive to activation of stress acceleration mode designation signal for holding a sense amplifier in inactive state.

In a third aspect of the invention, a semiconductor memory device includes: a plurality of memory cells arranged in a matrix; a plurality of word lines arranged corresponding to respective rows and connected to memory cells of corresponding rows; a driving power source node for receiving a word line driving voltage externally applied in an operation in the stress acceleration mode; a word line selecting portion for simultaneously selecting a predetermined number, at least two, of word lines according to an applied address signal in an operation in the stress acceleration mode; and a current limiting portion coupled between the driving power source node and the word line selecting portion for limiting the amount of current flowing between the driving power source node and the word line selecting portion.

Since a predetermined internal address signal bit is set into selected state, the number of word lines simultaneously selected can be set at an appropriate value in the stress acceleration mode of operation such as burn-in, preventing large current from flowing in driving the word lines.

Furthermore, since a bit line is set at a predetermined voltage level and the value of a cell plate voltage is adjusted in the stress acceleration mode, voltage stress can be applied to a gate insulating film of an access transistor and to a dielectric film of a memory cell capacitor under the same acceleration condition and thus a voltage stress acceleration testing of the access transistor can be carried out simultaneously with that of the memory capacitor.

Furthermore, since a current limiting portion limits current flowing in driving the word lines, any number of word lines can be stably driven into selected state, and highly reliable stress acceleration testing can be carried out while the time required for the testing can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 schematically shows an entire structure of a semiconductor memory device according to a first embodiment of the present invention.

FIG. 1 schematically shows a structure of the bit line precharging voltage switch circuit shown in FIG. 13.

DESCRIPTION OF THE PREFERRED EMBODIMENTS

[First Embodiment]

FIG. 1 schematically shows an entire configuration of a semiconductor memory device according to a first embodiment of the present invention. In FIG. 1, a memory cell array 1 is divided into a plurality of memory blocks MB0–MBn each having a plurality of memory cells arranged in a matrix. Provided at respective regions between adjacent memory blocks MB0–MBn and outside the array are sense amplifier bands SB0–SBn+1 which sense and amplify data on pairs of bit lines in corresponding memory blocks when activated. Each of memory blocks MB0–MBn also includes a word line corresponding to each row of memory cells and a pair of bit lines corresponding to each column of memory cells. Sense amplifier bands SB0–SBn each include a sense amplifier provided for each pair of bit lines.

Figure 25:
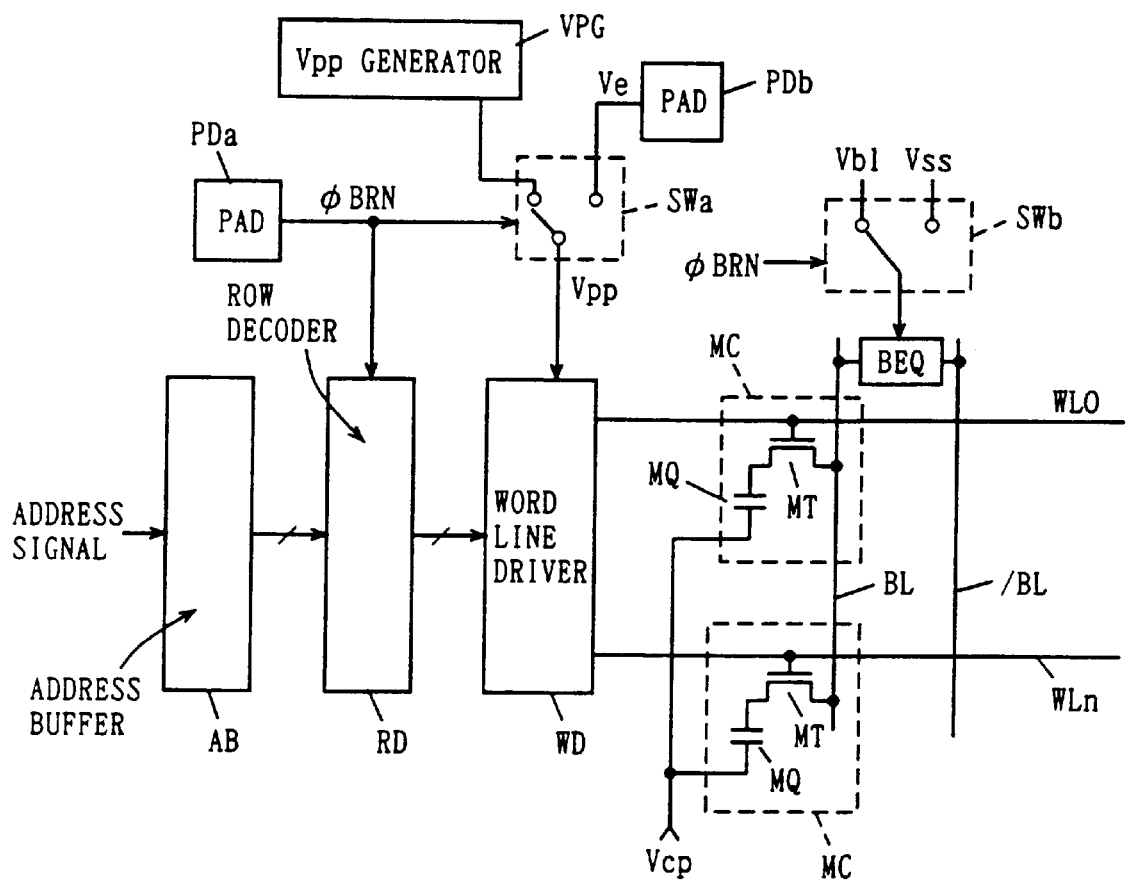
FIG. 25 schematically shows a structure of a main portion of a conventional semiconductor memory device.
Figure 26:
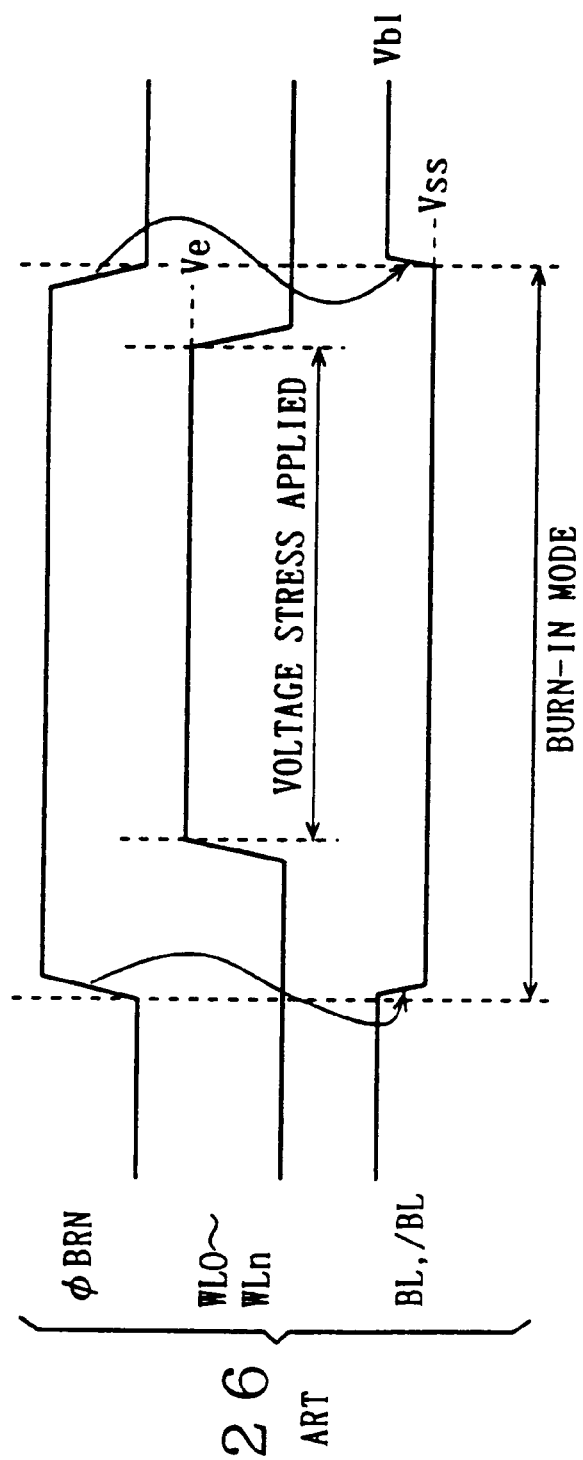
FIG. 26 Shows operation waveforms of the semiconductor memory device shown in FIG. 25 in the stress acceleration mode.

The memory cell is of a structure of one transistor and one capacitor, as is similar to that of memory cell MC shown in FIG. 25.

The semiconductor memory device further includes an address buffer 2 which latches externally applied address signal bits Adm–Ad0 in response to a row address latch designation signal RAL and generates internal address signal bits Ad and /Ad, an address control circuit 3 which designates the logic state of each of internal address signal bits Ad and /Ad applied from address buffer 2 in response to activation of a stress acceleration mode designation signal BIAC and also outputs an address bit in response to a row address enable signal RADE, a row predecoder 4 which predecodes an internal address signal bit RAD applied from address control circuit 3 to generate a predecoded signal X, and a row decoder/driver 5 which transfers boosted voltage Vpp onto a selected row of a selected block in memory cell array 1 in response to predecoded signal X from row predecoder 4.

When stress acceleration mode designation signal BIAC is activated, address control circuit 3, the structure of which will be detailed later, sets a predetermined address signal bit of internal address signal bits Ad and /Ad applied from address buffer 2 at a selected state (complementary address signal bits Ad and /Ad are both degenerated at H level) independently of their logic states and sets and outputs the remaining address signal bits at logic levels depending on the logic states thereof. By selectively setting internal address signal bits Ad and Ad at selected state, a desired number of word lines can be simultaneously selected and the current flowing in driving word lines is reduced as compared with a conventional method in which all of word lines are simultaneously selected.

The semiconductor memory device further includes a control clock generation circuit 6 which generates various internal control signals in response to externally applied row address strobe signal /RAS, column address strobe signal /CAS, write enable signal /WE and output enable signal /OE. FIG. 1 representatively shows row address latch designation signal RAL, row address enable signal RADE, sense amplifier activation signal SNP, bit line equalization designating signal BEQ and stress acceleration mode designation signal BIAC.

Figure 2:
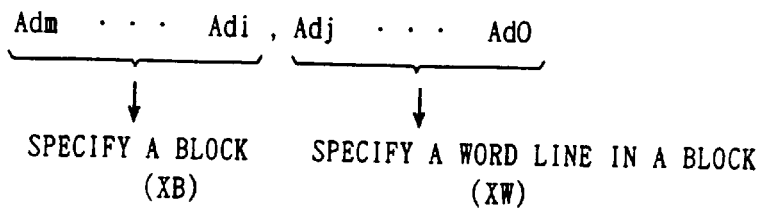
FIG. 2 schematically shows a configuration of the address signal bits shown in FIG. 1.

FIG. 2 shows a configuration of address signal bits. In FIG. 2, address signal bits Adm–Adi of address signal bits Adm–Ad0 correspond to a block specifying address which specifies a predetermined number (one or two) of memory block(s) of memory blocks MB0–MBn. The remaining address signal bits Adj–Ad0 correspond to a word line specifying address which specifies a row, that is, a word line within each block. Predecoding by row predecoder 4 produces a signal XB as a predecoded block specifying address signal and a predecoded signal XW for specifying a word line within a memory block. An operation of the semiconductor memory device shown in FIG. 1 will now be described with reference to the operation waveform diagram in FIG. 3. Hereinafter, acceleration of word line voltage for screening a defective bit will be described.

Figure 3:
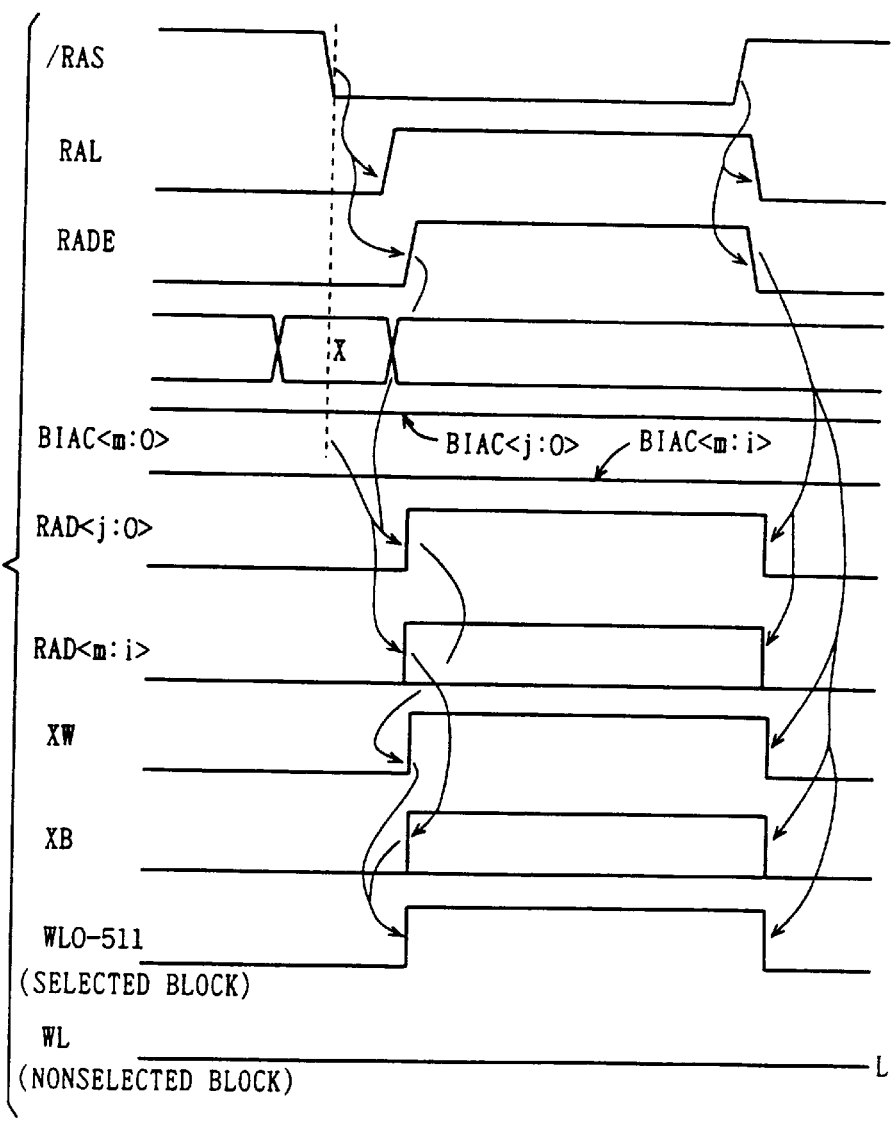
FIG. 3 is a signal waveform diagram illustrating an operation of the semiconductor memory device shown in FIG. 1.

In response to stress acceleration mode designation signal BIAC, address control circuit 3 sets block specifying address signal bits Adm–Adi (=Ad <m:i>) at logic states corresponding to internal address signal bits applied from address buffer 2 and sets the remaining address signal bits of intra-block word line specifying address bits Adj–Ad0 (=Ad <j:0>) at normally selected state (i.e., degenerated state). FIG. 3 shows a case where stress acceleration mode designation signal BIAC is generated for each address signal bit. Thus, according to the bit-by-bit address control, stress acceleration mode designation signals BIAC <j:0> attain an active H level and stress acceleration mode designation signals BIAC <m:i> are inactivated. In the state thus set, signals for specifying a word line within a block are all set at selected state, while only block specifying address signal bits are rendered valid.

When row address strobe signal /RAS falls to an active L level and then a predetermined time period elapses, row address latch designation signal RAL rises to an H level. In response to the row address latch designation signal RAL, address buffer 2 is set at a latching state, incorporates and latches address signal bits Adm–Ad0 which have been applied theretofore, and outputs row address signal bits Ad, /Ad. Address control circuit 3 sets all of respective intra-block word line specifying address bits Ad <j:0> from address buffer 2 at selected state, and also makes valid and outputs a block specifying address (here, "valid" or "valid state" refers to an outputting of a bit corresponding to an applied address signal bit or to a non-degenerated state). Thus, row address bits RAD <j:0> from address control circuit 3 are all in selected state and block specifying address signal bits RAD <m:i> are in a valid state.

Predecoder 4 predecodes address signal bits RAD <m:0> applied via address control circuit 3, and sets all word line specifying signals XW at selected state and also renders block specifying address signal XB valid to specify one memory block.

Then row decoder/driver 5 is activated, decodes predecoded signal X (XW, XB) applied from row predecoder 4, drives all of word lines WL0–511 in a selected block into selected state, and transfers high voltage Vpp onto the word lines. Word lines in the remaining blocks are all maintained in non-selected state. One memory block is now assumed to have 512 word lines WL.

Figure 4A:
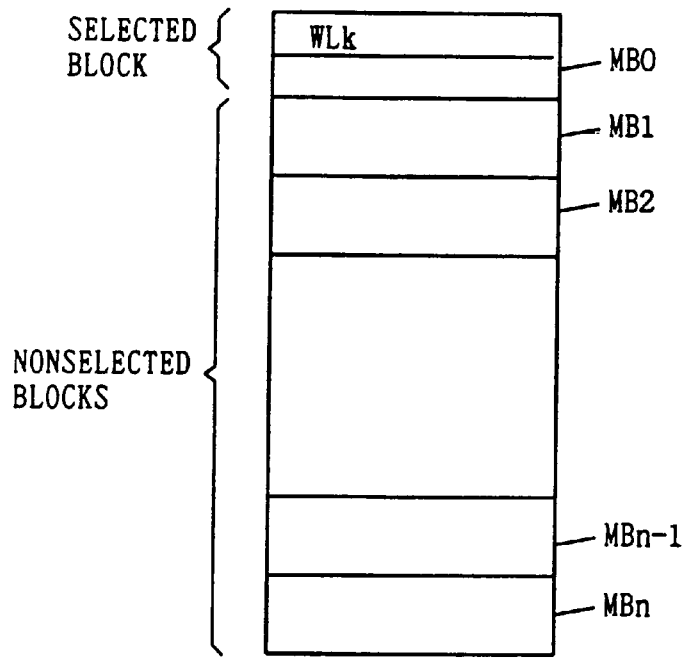
FIGS. 4A and 4B are diagrams for illustrating an operational effect of the address control circuit shown in FIG. 1.
Figure 4B:
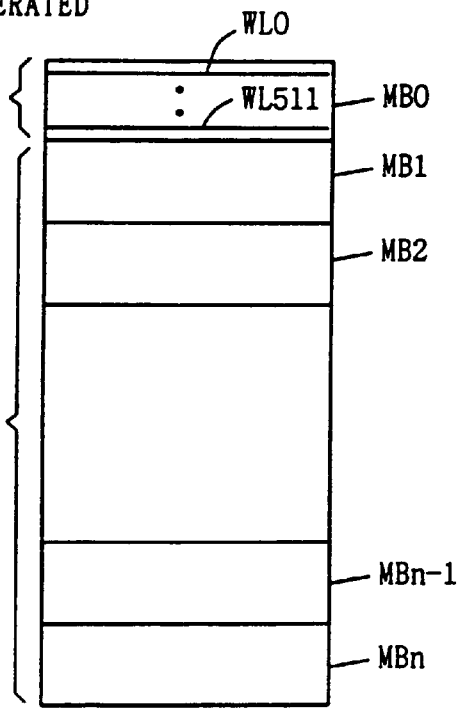

FIGS. 4A and 4B schematically shows a word line selecting manner. FIG. 4A shows a word line selecting manner in a mode of operation other than the stress acceleration mode (i.e., the normal mode). In this state, address signal bits Ad <m:0> are all valid and a memory block and a word line are selected according to the applied address signal bits Ad <m:0>. FIG. 4A shows one example where a memory block MB0 of memory blocks MB0–MBn is designated and one word line WLk is selected in the designated memory block MB0.

Meanwhile, as shown in FIG. 4B, when stress acceleration mode designation signal BIAC is activated, address signal bits Ad <m:i> for specifying a memory block are valid and word line specifying address bits Ad <j:0> are degenerated. In this state, a memory block is selected according to block address signal bits Ad <m:i> and all word lines within the selected memory block are driven into selected state. FIG. 4B shows one example where memory block MB0 is selected and word lines WL0–WL511 in the selected memory block MB0 are all driven into selected state.

Since word lines WL0–WL511 within one memory block are all activated and stress acceleration is carried out in units of memory blocks, burn-in time period can be reduced to approximately 1/500 of that when stress acceleration is carried out according to the normal mode of operation. Furthermore, since only one memory block out of memory blocks MB0–MBn is selected, a current of only 1/(n+1) times the amount of current flowing when all of word lines are activated flows, failure due to large current is not caused and stress acceleration testing such as burn-in testing can be efficiently carried out without degrading reliability of the device.

In the stress acceleration testing, all of internal circuits of a semiconductor memory device may be operated so as to simultaneously accelerate voltage stress for all circuits of the semiconductor memory device. Furthermore, a word line may be driven into selected state DC (direct current)-wise while a sense amplifier and the like may be held in an inactive state, so that a gate insulating film of an access transistor of a memory cell can be screened. Each circuit operation need only be determined depending on the content of the screening test of interest.

Figure 5:
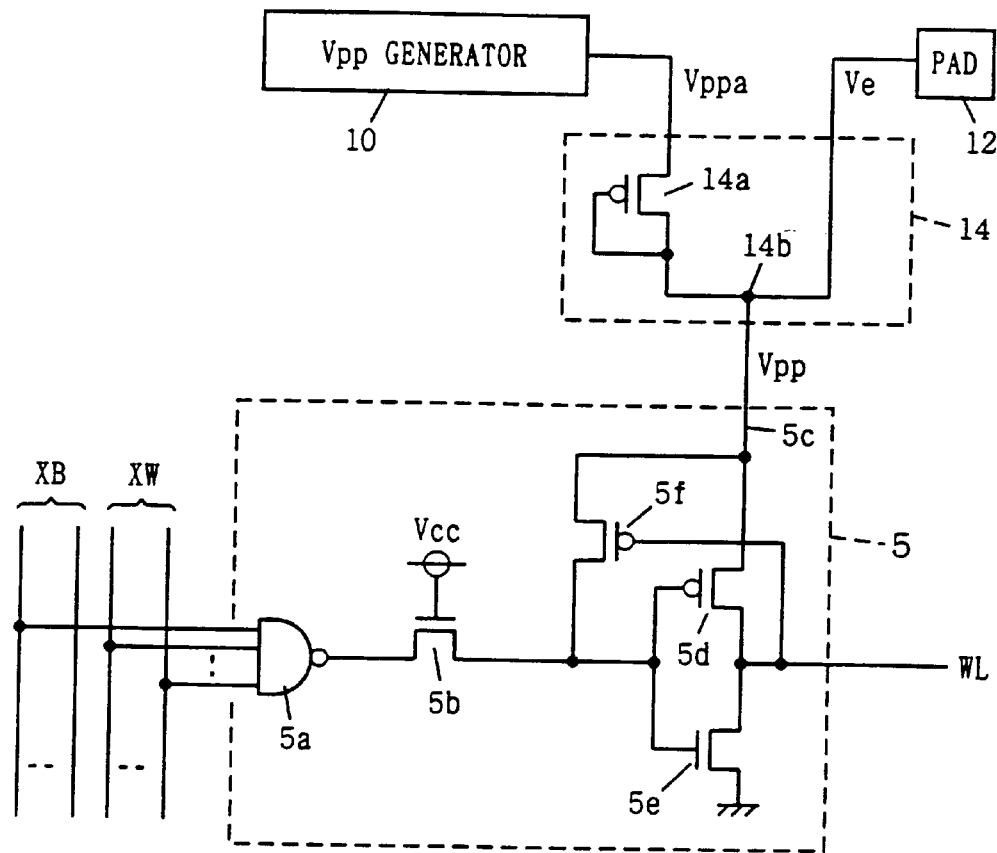
FIG. 5 schematically shows a structure of the row decoder/driver portion shown in FIG. 1.

FIG. 5 shows one example of the structure of the row decoder/driver portion. FIG. 5 representatively shows a structure of the row decoder/driver circuit portion provided for one word line WL. In FIG. 5, row decoder/driver 5 includes an NAND circuit 5a which receives a predetermined combination of a block predecoded signal XB and a word line predecoded signal XW, an n channel MOS transistor 5b which receives operating power supply voltage Vcc at its gate and passes an output signal of NAND circuit 5a, a p channel MOS transistor 5d which is connected between a high voltage applying node 5c and word line WL and receives at its gate a voltage applied via MOS transistor 5b, an n channel MOS transistor 5e which is connected between a ground node and word line WL and receives at its gate a signal applied via MOS transistor 5b, and a p channel MOS transistor 5f which is connected between node 5c and the gates of MOS transistors 5d and 5e and has its gate connected to word line WL.

NAND circuit 5a receives a predecoded signal out of block predecoded signals XB which specifies a memory block including the word line WL, and a predetermined combination of word line specifying predecoded signals XW. When word line WL is designated, the output signal of NAND circuit 5a attains an L level, MOS transistor 5d is turned on, MOS transistor 5a is turned off, and word line WL is driven to the high voltage Vpp level via MOS transistor 5d. In response to the increased voltage of word line WL, MOS transistor 5f is turned off.

When word line WL is not selected, the output signal of NAND circuit 5a attains an H level, MOS transistor 5e is turned on and MOS transistor 5d is turned off. In this state, word line WL is driven to the ground voltage level.

Responsively MOS transistor 5f is turned on and transfers boosted voltage Vpp applied to high voltage node 5c to the gates of MOS transistors 5d and 5e. Thus MOS transistor 5d is completely turned off.

MOS transistor 5b is provided to prevent boosted voltage Vpp transferred when MOS transistor 5f is turned on from exerting adverse affect on NAND circuit 5a. When boosted voltage Vpp is transferred, MOS transistor 5b transfers to the output portion of NAND circuit 5a only the voltage of power supply voltage Vcc at its gate less its threshold voltage. Thus, the level of the output signal of NAND circuit 5a is an H level and MOS transistor 5b is turned off.

High voltage applying node 5c of row decoder/driver 5 receives one of boosted voltage Vppa from Vpp generation circuit 10 and voltage Ve externally applied to pad 12 via switch circuit 14. Switch circuit 14 is commonly provided to all word line drive circuits included in row decoder/driver 5. Switch circuit 14 includes a p channel MOS transistor 14a connected between an output node of Vpp generation circuit 10 and a node 14b and having its gate connected to node 14b.

When voltage applying Ve externally applied via pad 12 is higher than boosted voltage Vppa from Vpp generation circuit 10, MOS transistor 14a is turned off and the externally applied voltage Ve does not adversely affect Vpp generation circuit 10. Vpp generation circuit 10 typically generates boosted voltage Vpp using a capacitor which performs charge pump operation in response to a clock signal. When MOS transistor 14a is not provided and a clamping transistor is provided at the output portion of Vpp generation circuit 10, high voltage Ve externally applied to pad 12 is discharged via the clamping transistor of Vpp generation circuit 10 and current consumption is increased. Provision of MOS transistor 14a ensures disconnection between Vpp generation circuit 10 and row decoder/driver 5 when high voltage Ve is applied to pad 12.

The high voltage Ve externally applied to pad 12 allows each word line to be driven into selected state with sufficient driving capability in simultaneously selecting all of word lines (512 word lines, for example) in one memory block. If Vpp generation circuit 10 is preset to have a driving capability large enough to drive all word lines in one memory block to selected state, switch circuit 14 and pad 12 are not required and boosted voltage Vppa can be used (it is not necessary to rapidly drive an addressed word line to selected state in the stress acceleration mode, since high voltage stress need only be applied independently of access time). Even if word lines more than those selected during a normal operation cycle are simultaneously driven to selected state in the stress acceleration mode, the externally applied voltage Ve can surely drives the word lines to be selected into selected state in the stress acceleration mode.

Figure 6:
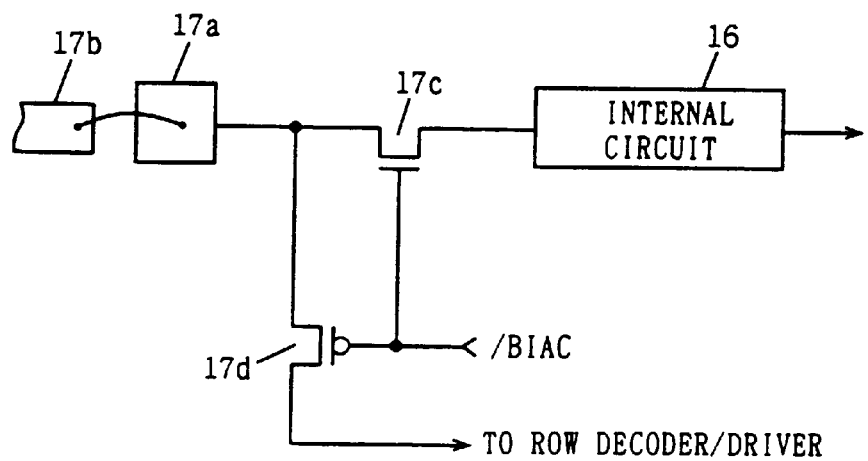
FIG. 6 schematically shows a structure of a modification of the pad arrangement shown in FIG. 5.

FIG. 6 shows another configuration to externally apply high voltage. In FIG. 6, a pad 17a is used which is provided for an internal circuit 16 which in turn performs a predetermined function. Pad 17a is connected to an external pin terminal 17b and receives, for example, output enable signal /OE. Provided between pad 17a and internal circuit 16 is an n channel MOS transistor 17c which receives at its gate a signal /BIAC of the inverted version of the stress acceleration designation signal. Furthermore, a p channel MOS transistor 17d which has its gate receiving stress acceleration mode designation signal /BIAC is provided between pad 17a and high voltage node 5c (FIG. 5) of the row decoder/driver. Stress acceleration mode designation signal /BIAC changes between boosted voltage Vppa and ground voltage GND.

In the normal mode of operation (i.e., except operations in the stress acceleration mode), stress acceleration mode designation signal/BIAC attains an H level, MOS transistor 17c is turned on and MOS transistor 17d is turned off. Thus internal circuit 16 is connected to external pin terminal 17b via pad 17a. The high voltage node of the row decoder/driver is disconnected from pad 17a. When stress acceleration mode designation signal /BIAC is activated, MOS transistor 17c is turned off, MOS transistor 17d is turned on and internal circuit 16 is disconnected from pad 17a. In this state, a desired high voltage Ve is applied to pin terminal 17b. High voltage node 5c of the row decoder/driver receives a desired high voltage Vpp via pads 17a and 17b. Use of MOS transistors 17c and 17d allows a pin terminal used during a normal operation cycle to be used as a high voltage applying terminal in the stress acceleration mode, and a required high voltage for driving word lines can be applied without employing any extra pin terminal. Pin terminal 17b has only to be a pin terminal which is not used in the stress acceleration mode and may, for example, be an address pin terminal which in turn is degenerated in the stress acceleration mode.

Figure 7:
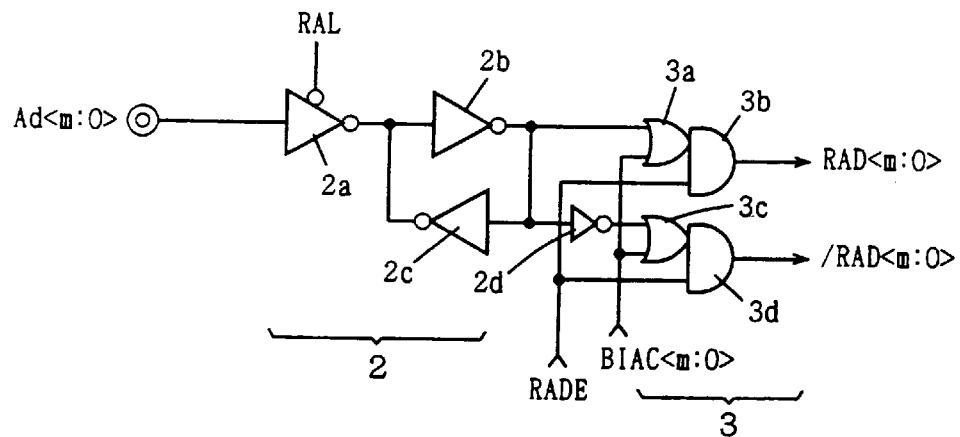
FIG. 7 schematically shows a structure of the address buffer and that of the address control circuit shown in FIG. 1.

FIG. 7 shows one example of the configuration of the address buffer and address control circuit shown in FIG. 1. In FIG. 7, the address buffer circuit and address control circuit provided for each address bit has a same configuration, and FIG. 7 shows a circuit for all bits <m:0>. In FIG. 7, address buffer 2 includes a tristate inverter buffer 2a which receives externally applied address signal bits Ad <m:0> and passes them in response to row address latch designation signal RAL, an inverter circuit 2b which inverts an output signal from tristate inverter buffer 2a, an inverter circuit 2c which inverts and transfers an output signal of inverter circuit 2b to an input portion of inverter circuit 2b, and an inverter circuit 2d which receives the output signal of inverter circuit 2b. Inverter circuits 2b and 2c form an inverter latch.

Address control circuit 3 includes an OR circuit 3a which receives the output signal of inverter circuit 2b and stress acceleration mode designation signals BIAC <m:0>, an AND circuit 3b which receives an output signal of OR circuit 3a and row address enable signal RADE, an OR circuit 3c which receives an output signal of inverter circuit 2d and stress acceleration mode designation signals BIAC <m:0>, and an AND circuit 3d which receives an output signal of OR circuit 3c and row address enable signal RADE.

OR circuit 3a and AND circuit 3b form a composite gate, and OR circuit 3c and AND circuit 3d form a composite gate. AND circuit 3b outputs row address signal bits RAD <m:0>, and AND circuit 3d outputs complementary row address signal bits /RAD <m:0>.

When row address latch designation signal RAL is inactivated at L level in the configuration of the address buffer/control circuit shown in FIG. 7, tristate inverter buffer 2a acts as an inverter, and inverts and transfers externally applied address signal bits Ad <m:0>. Inverter circuits 2b and 2c latches the address signal bits from tristate inverter buffer circuits 2a. During a stand-by cycle, row address enable signal RADE attains an L level and internal row address signal bits RAD <m:0> and /RAD <m:0> from AND circuits 3b and 3d both attain L level.

When an access cycle is started, in response to a falling edge of row address strobe signal /RAS row address latch designation signal RAL attains an H level when a predetermined time period elapses. In this state, tristate inverter buffer 2a is put into an output high impedance state and prohibits internal transfer of external address signal bits Ad <m:0>. Inverter circuits 2b and 2c have latched the address signal bits immediately before tristate inverter buffer 2a is put into the output high impedance state. After row address latch designation signal RAL attains an active H level, row address enable signal RADE is activated.

During a normal operation cycle, stress acceleration mode designation signals BIAC <m:0> are at L level and OR circuits 3a and 3c operate as buffers. Thus, in response to activation of row address enable signal RADE in a normal cycle, internal row address signal bits RAD <m:0> and /RAD <m:0> are generated according to the latched internal address signal bits. In the stress acceleration mode of operation, stress acceleration mode designation signals BIAC <m:0> selectively attain an active H level. In the above embodiment, stress acceleration mode designation signals BIAC <m:j> for block address signal bits Ad <m:j> attain L level, stress acceleration mode designation signals BIAC <i:0> for address signal bits Ad <i:0> for specifying a word line attain H level, and the address signal bits for specifying a word line are degenerated. Upon degeneration, internal address signal bits RAD <i:0> and /RAD <i:0> output from AND circuits 3b and 3d are all in selected state at H level. Thus, a memory block is selected in response to an externally applied address signal for specifying a block and all word lines within the selected memory block are designated.

Figure 8:
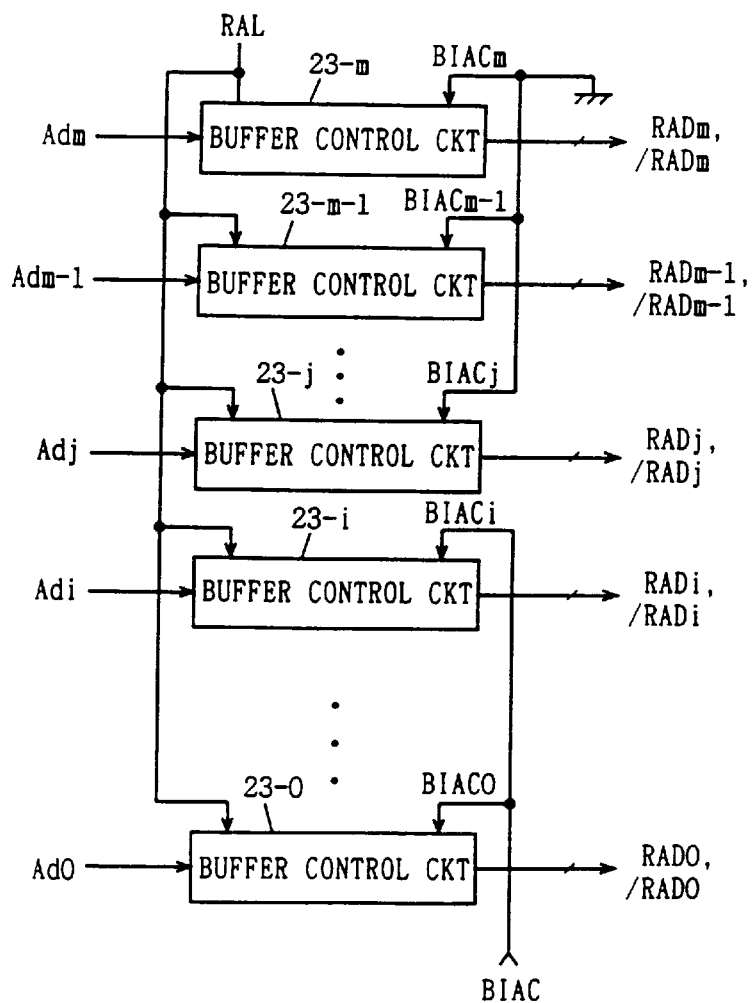
FIG. 8 schematically shows a structure of the address buffer and that of the address control circuit shown in FIG. 1.

FIG. 8 schematically shows the entire configuration of the address buffer and the address control circuit. In FIG. 8, the address buffer and the address control circuit are shown as a buffer control circuit 23 by one block. In FIG. 8, buffer control circuits 23-m–23-0 are provided for address bits Adm–Ad0, respectively. Buffer control circuits 23-m–23-0 commonly receive row address latch designation signal RAL. Buffer control circuits 23-m–23-j provided for address signal bits Adm–Adj receive stress acceleration mode designation signals BIACm–BIACj fixed at the ground voltage level, respectively.

Meanwhile, buffer control circuits 23-j–23-0 provided for address signal bits Adi–Ad0 receive stress acceleration mode designation signal BIAC as stress acceleration mode designation signals BIACi–BIAC0. Internal address signal bits RADm, /RADm–RADj, /RADj for specifying a memory block are output according to address signal bits Adm–Adj in both a normal operation cycle and the stress acceleration mode. Word line specifying, internal row address signal bits RADi, /RADi–RAD0, /RAD are output according to address signal bits Adi–Ad0 during a normal cycle, and are all set to selected state of H level in the stress acceleration mode.

Buffer control circuits 23-m–23-0 all have a same circuit configuration. Thus, layout of the circuits can be readily achieved and a signal propagation delay can be made the same and hence accurate decode operation can be achieved.

Furthermore, since buffer control circuits 23-m–23-0 all have the same circuit configuration, a desired distribution form of word lines simultaneously driven to selected state in the stress acceleration mode can be readily implemented by forming a propagation path of stress acceleration mode designation signals BIAC through mask interconnection, as is described below, and thus flexible, word line selecting manner can be readily implemented.

Figure 9:
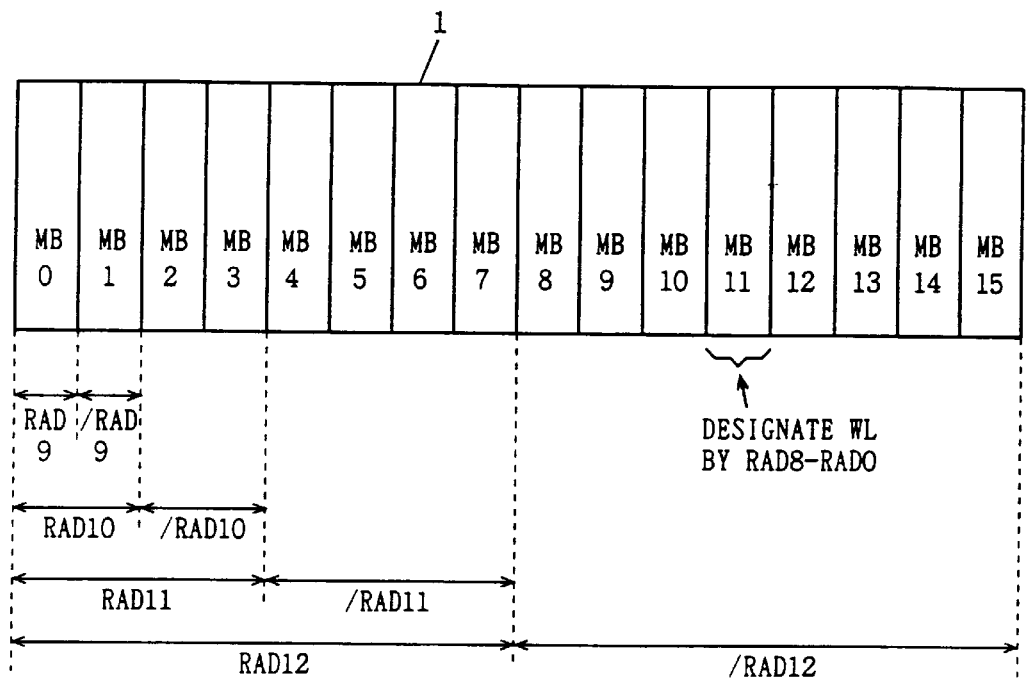
FIG. 9 shows an example of address bit allocation in a memory block of a semiconductor memory device according to the first embodiment of the present invention.

FIG. 9 shows memory cell array 1 divided into 16 memory blocks MB0–MB15. A memory block is specified by the four bits of address bits RAD12–RAD9. A word line within one memory block is specified by address bits RAD8–RAD0. Memory blocks MB0–MB7 are designated when row address bit RAD12 attains an H level, and memory blocks MB8–MB15 are designated when row address bits /RAD12 attains an H level.

In memory blocks MB0–MB7, memory blocks MB0–MB3 are designated when row address bit RAD11 attains an H level, and memory blocks MB4–MB7 are designated when row address bit /RAD11 attains an H level.

In memory blocks MB0–MB3, memory blocks MB0 and MB1 are designated when row address bit RAD10 attains an H level, and memory blocks MB2 and MB3 are designated when row address bit /RAD10 attains an H level. Memory block MB0 is designated when row address bit RAD9 attains an H level, and memory block MB1 is designated when row address bit /RAD9 attains an H level.

The other memory blocks are similarly allotted with row address bits. In the allotting of address bits shown in FIG. 9, when address bits RAD12 and /RAD12 both attain H level, for example, a memory block is specified according to remaining address bits RAD11–RAD9 and two memory blocks are simultaneously selected. For example, when memory block MB0 is designated, memory block MB8 is also designated simultaneously. Furthermore, when address bits RAD9 and /RAD9 both attain H level, two adjacent memory blocks such as memory blocks MB0 and MB1 are simultaneously specified. Thus, any number of address bits of a block address can be set into degenerated state (true and complementary address bits are both selected at H level) to simultaneously select a desired number of memory blocks.

This applies to address bits RAD8–RAD0 for specifying a word line. For example, when the least significant row address bit RAD0 is degenerated, two adjacent word lines are simultaneously specified in one memory block. When address signals of least significant three bits are degenerated, eight adjacent word lines can be simultaneously selected.

Figure 10:
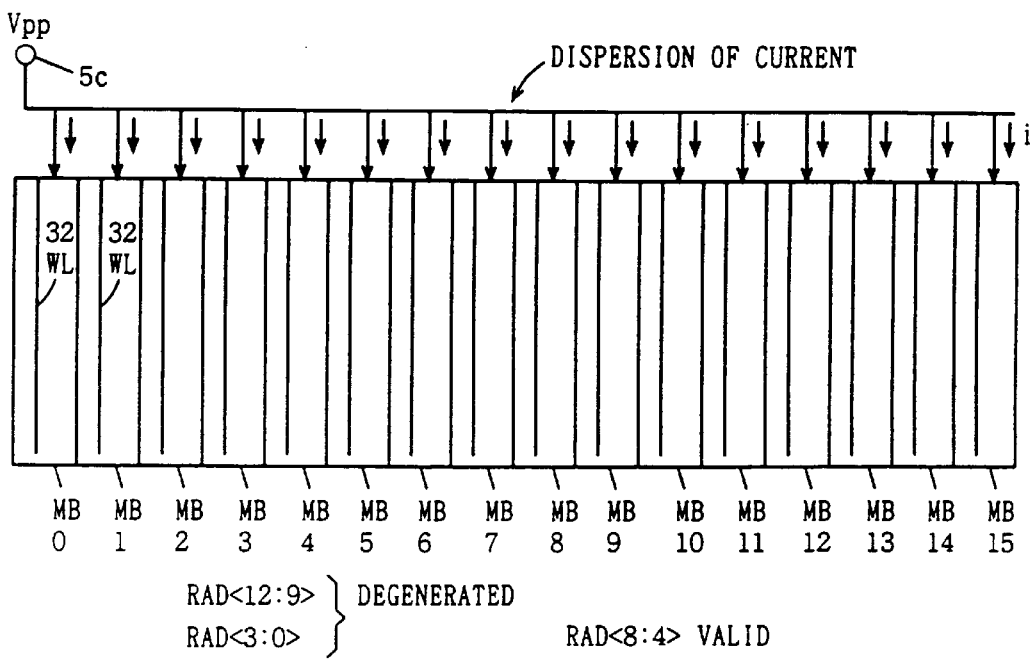
FIG. 10 schematically shows a structure of a first modification of a semiconductor memory device according to the first embodiment of the present invention.

Thus, a plurality of word lines can be simultaneously selected in all memory blocks, as shown in FIG. 10.

FIG. 10 shows one example when a word line is selected in all memory blocks. FIG. 10 shows that row address bits RAD <12:9> and RAD <3:0> are set at degenerated state and the remaining address signal bits RAD <8:4> are made valid in the stress acceleration mode. Row address bits RAD <12:9> are address signal bits for specifying a memory block and designate all of memory blocks MB0–MB15 when they are set at degenerated state. Row address bits RAD <3:0> are address signal bits for specifying a word line. Since the address bits of least significant four bits are degenerated, 32 word lines (32WL) are simultaneously selected in one memory block. Thus, since a plurality of (32) word lines are simultaneously driven into selected state in each of memory blocks MB0–MB15, current I at the high voltage applying node is dispersed (represented as current i) over all of memory blocks MB0–MB15. Thus, current for driving word lines will not be concentrated at one memory block, current concentration at one interconnection line and hence destruction of an interconnection line due to localized current concentration in driving word lines can be prevented.

It should be appreciated that the word line selecting manner shown in FIG. 10 can be readily set by changing a buffer control circuit which receives stress acceleration mode designation signal BIAC among buffer control circuits shown in FIG. 8.

Figure 11:
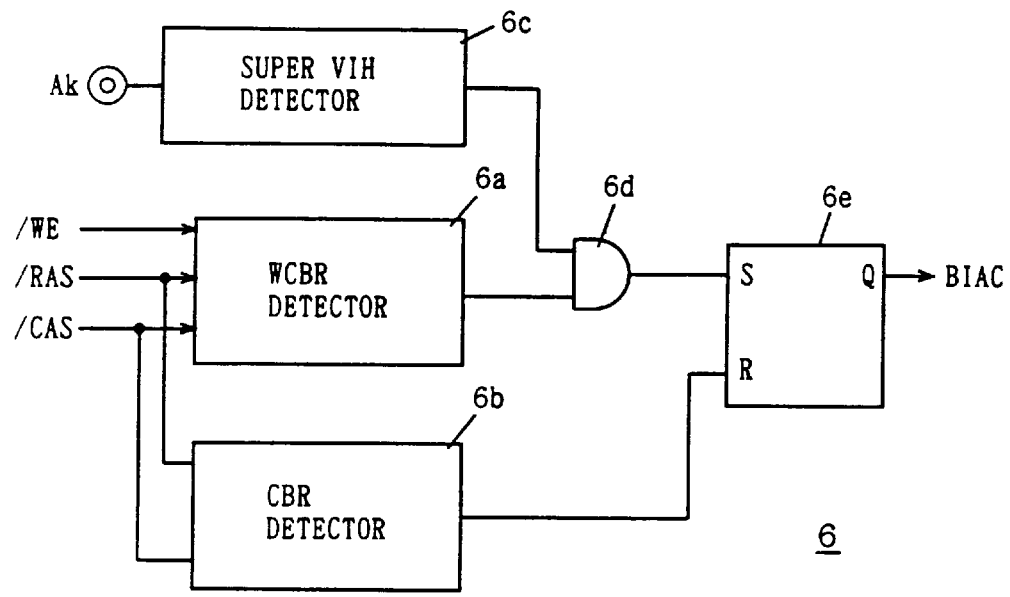
FIG. 11 schematically shows a structure of a stress acceleration mode designation signal generating portion in the control clock generation circuit shown in FIG. 1.
Figure 12:
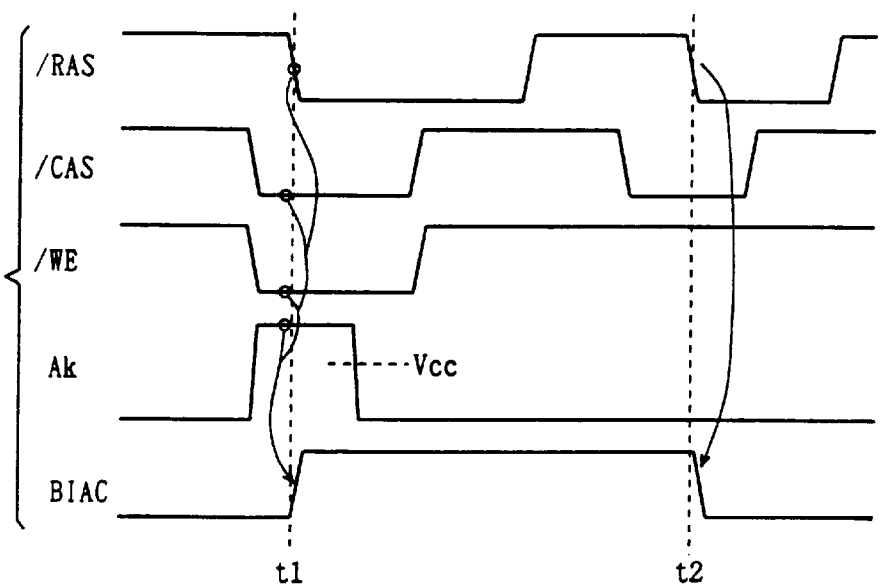
FIG. 12 is a signal waveform diagram illustrating an operation of the circuits shown in FIG. 11.

FIG. 11 schematically shows a configuration of a stress acceleration mode designation signal generating portion included in control clock generation circuit 6 shown in FIG. 1. In FIG. 11, control clock generation circuit 6 includes a WCBR detector circuit 6a which receives row address strobe signal IRAS, column address strobe signal /CAS and write enable signal /WE and detects whether WCBR condition is satisfied, a CBR detector circuit 6b which receives row address strobe signal /RAS and column address strobe signal /CAS and detects whether CBR condition is satisfied, a super VIH detector circuit 6c which detects whether a signal input to a predetermined pin terminal (an address signal pin terminal Ak, for example) is set at a voltage level sufficiently higher than a normally applied voltage level, AND circuit 6d which receives a WCBR detection signal from WCBR detector circuit 6a and a super VIH detection signal from super VIH detector circuit 6c, and a set/reset flipflop 6e which is set in response to a rising of an output signal from AND circuit 6d and is reset in response to a rising of a CBR detection signal from CBR detector circuit 6b. An output Q of set/reset flipflop 6e outputs stress acceleration mode designation signal BIAC. Set/reset flipflop 6e is a set-prioritized prioritized flipflop. An operation of the circuitry shown in FIG. 11 will now be described with reference to the waveform diagram shown in FIG. 12.

Prior to time t1, column address strobe signal /CAS and write enable signal /WE are both set at L level and a signal input to a specific terminal (address pin terminal) Ak is set at a voltage level sufficiently higher than a normal voltage level (Vcc level).

At time t1 when row address strobe signal /RAS falls to an L level, column address strobe signal /CAS and write enable signal /WE are both at L level, WCBR condition is satisfied and thus the output signal from WCBR detector circuit 6a attains an H level. Furthermore, super VIH detector circuit 6c sets a detection signal at an H level according to pin terminal Ak which is set at the high voltage level. Responsively, the output signal from AND circuit 6d rises to an H level, set/reset flipflop 6e is set, and stress acceleration mode designation signal BIAC attains an H level. While CBR detector circuit 6b also detects CBR condition, stress acceleration mode designation signal BIAC attains an active H level, since the set/reset flipflop is a set-prioritized type. The output signal of CBR detector circuit 6b may be provided to an AND circuit which receives write enable signal /WE at one input, and an output signal of the AND circuit may be input to a reset input R of set/reset flipflop 6e. In this configuration, the output signal from CBR detector circuit 6b is inactivated when WCBR condition is satisfied.

Column address strobe signal /CAS is set at an L level before row address strobe signal /RAS falls from an H level to an L level at time t2. In this state, write enable signal /WE is held at an H level. This causes a CBR detection signal from CBR detector circuit 6b to rise to an H level, whereas an output signal from WCBR detector circuit 6a is inactivated. Thus, set/reset flipflop 6e is reset and stress acceleration mode designation signal BIAC attains an inactive L level.

The specific address signal pin terminal Ak need only be a pin terminal which is not used in the stress acceleration mode and an address signal pin terminal which in turn is degenerated in the stress acceleration mode. It may be another data input/output pin terminal.

When the stress acceleration mode is entered under a so-called WCBR+super VIH condition as shown in FIG. 11, a semiconductor memory device can be readily set in the stress acceleration mode without using any extra pin terminal.

Timing conditions for super VIH detector circuit 6c, WCBR detector circuit 6a and CBR detector circuit 6b are standardized by the JEDEC (Joint Electron Devices Engineers Council) and any well-known configurations can be used as their respective circuit configurations.

It is noted that WCBR+super VIH condition+address key condition may be satisfied for activation of stress acceleration mode designation signal BIAC. Address key means a condition that an address signal input to a specific address pin terminal is set at a predetermined logic level.

According to the first embodiment of the present invention, since a desired number of word lines can be simultaneously driven to selected state, large current flow for driving word lines in the stress acceleration mode and hence defect due to the large current can be prevented. Furthermore, the current flowing from a boosted voltage applying node to each word line driver in selecting word lines has been described as an issue to be solved. However, large current also flows from a selected word line to a ground line when each word line driven to a boosted voltage level is driven to non-selected state. Thus, the number of word lines driven to selected state can be a minimum necessary number to ensure that large current will not flow into the ground line, thereby avoiding defect in the ground line. According to the first embodiment, fast and highly reliable stress acceleration testing thus can be achieved.

[Second Embodiment]

Figure 13:
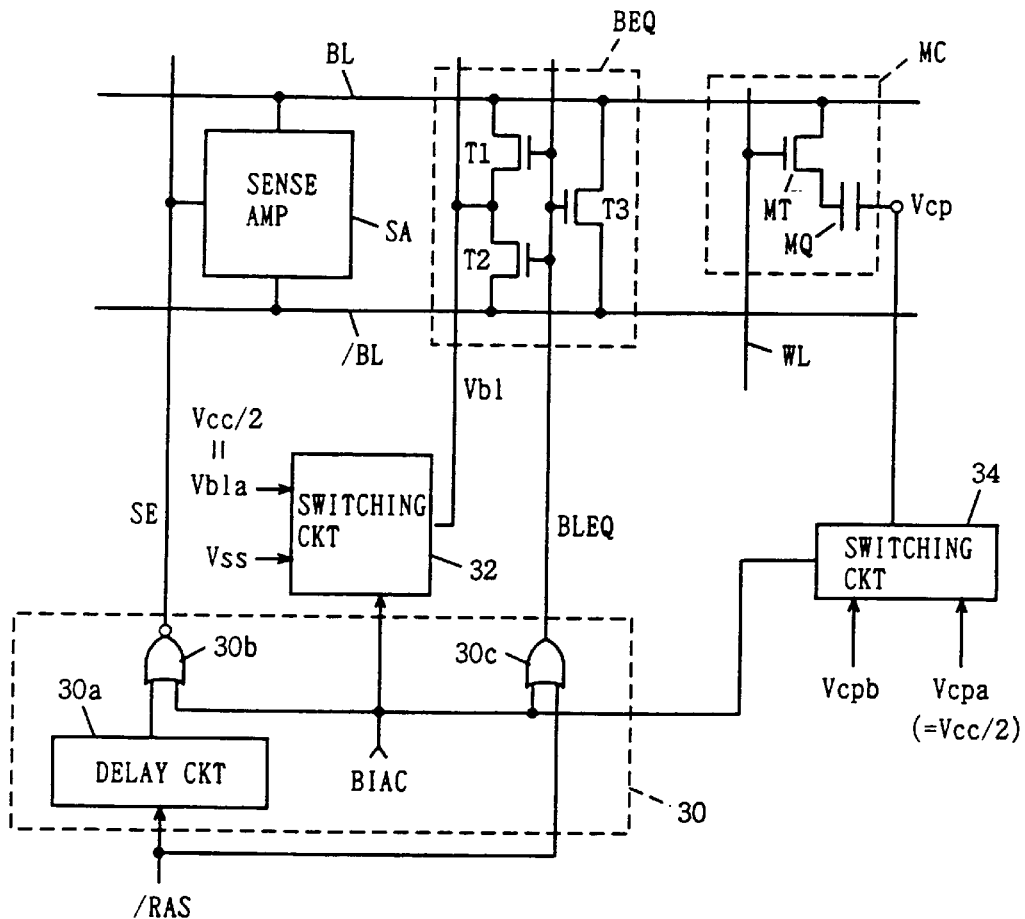
FIG. 13 schematically shows a structure of a main portion of a semiconductor memory device according to a second embodiment of the present invention.

FIG. 13 schematically shows a configuration of a main portion of a semiconductor memory device according to a second embodiment of the present invention. FIG. 13 representatively shows a configuration of a portion related to a pair of bit lines BL and /BL. A memory cell MC is arranged corresponding to an intersection of the pair of bit lines BL and /BL and a word line WL. Memory cell MC includes a memory capacitor MQ which receives a predetermined cell plate voltage Vcp at one electrode (cell plate electrode), and an access transistor MT formed of an n channel MOS transistor which is turned on in response to a signal potential of word line WL and connects memory capacitor MQ to bit line BL.

Bit lines BL and /BL are provided with a bit line equalization circuit BEQ which is activated to transfer a predetermined voltage Vb1 to bit lines BL and /BL in response to activation of a bit line equalization designating signal BLEQ, and a sense amplifier SA which is activated to differentially in response to activation of a sense amplifier activation signal SE amplify signal potentials on bit lines BL and /BL.

Bit line equalization circuit BEQ includes n channel MOS transistors T1 and T2 which are turned on to transfer bit line precharging voltage Vb1 to bit lines BL and /BL, respectively, in response to activation of bit line equalization designating signal BLEQ and an n channel MOS transistor T3 which is turned on in response to activation of bit line equalization designating signal BLEQ, for electrically short-circuit bit lines BL and /BL.

Bit line precharging voltage Vb1 is output from a switching circuit 32 which selects one of an intermediate voltage Vb1a (=Vcc/2) and a ground voltage Vss in response to stress acceleration mode designation signal BIAC.

Cell plate voltage Vcp to memory cell MC is applied from switching circuit 34 which selects and outputs one of a voltage Vcpb and an intermediate voltage Vcpa (=Vcc/2) in response to stress acceleration mode designation signal BIAC.

In order to control activation/deactivation of bit line equalization circuit BEQ and sense amplifier SA, a row-related control circuit 30 is provided which outputs a sense amplifier activation signal SE and bit line equalization designating signal BLEQ in response to row address strobe signal /RAS. Row-related control circuit 30 includes a delay circuit 30a which delays row address strobe signal /RAS for a predetermined time period, an NOR circuit 30b which receives an output signal from delay circuit 30a and stress acceleration mode designation signal BIAC, and an OR circuit 30c which receives stress acceleration mode designation signal BIAC and row address strobe signal /RAS. OR circuit 30b output sense amplifier activation signal SE and OR circuit 30c outputs bit line equalization designating signal BLEQ.

S An operation thereof will now be briefly described. Stress acceleration mode designation signal BIAC is at an inactive L level in the normal operation cycle. In this state, switching circuit 32 selects and outputs a predetermined intermediate voltage Vb1a as bit line precharging voltage Vb1. Switching circuit 34 selects and outputs a predetermined intermediate voltage Vcpa as cell plate voltage Vcp for application to a cell plate of memory cell capacitor MQ.

NOR circuit 30b acts as an inverter to invert an output signal from delay circuit 30a in the normal mode of operation. OR circuit 30c merely operates as a buffer to buffer and output row address strobe signal /RAS. Thus, when row address strobe signal /RAS falls to an L level, bit line equalization designating signal BLEQ attains an L level and each of MOS transistors T1–T3 of bit line equalization circuit BEQ are all turned off. Then, a word line is selected by a circuit (not shown) and the voltage level of word line WL rises. When a predetermined time period (a delay time of delay circuit 30) has elapsed since row address strobe signal /RAS falls, NOR circuit 30b activates sense amplifier activating signal SE at its output to H level to activate sense amplifier SA. Thus, memory cell data read on bit lines BL and /BL is sensed and amplified.

Figure 14:
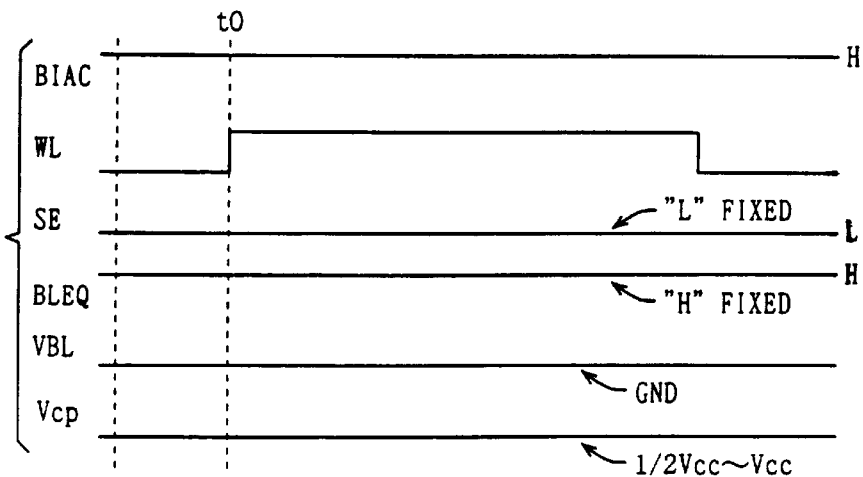
FIG. 14 is a signal waveform diagram illustrating an operation of the semiconductor memory device shown in FIG. 13.

This operation is the same as the operation in the normal mode of operation of a typical dynamic type semiconductor memory device. An operation in the stress acceleration mode will now be described with reference to FIG. 14.

In the operation in the stress acceleration mode, stress acceleration mode designation signal BIAC attains an active H level and switching circuit 32 selects and outputs ground voltage Vss as bit line precharging voltage Vb1. In response to the H-level stress acceleration mode designation signal BIAC, OR circuit 30c normally holds bit line equalization designating signal BLEQ at an H level, which causes bit lines BL and /BL to be held at the ground voltage Vss (GND) level. Furthermore, switching circuit 34 selects and outputs voltage Vcpb as cell plate voltage Vcp. Voltage Vcpb is at a voltage level equal to or higher than intermediate voltage Vcpa and can be externally controlled.

A word line selecting operation is performed in this state at time t0, and data stored in memory cell MC is transferred to bit line BL when word line WL rises to an H level.

Stress acceleration mode designation signal BIAC has been fixed at an H level. Even when an output signal from delay circuit 30a falls to an L level, the output signal from NOR circuit 30b keeps an L level, sense amplifier activating signal SE is held inactivated, and sense amplifier SA does not perform a sensing operation.

In this state, access transistor MT of memory cell MC is turned on and an inter-electrode voltage of memory capacitor MQ is Vcpb. This allows further acceleration of voltage stress on a dielectric film of memory capacitor MQ and hence faster operation in the stress acceleration mode for the dielectric film of the memory cell capacitor.

Voltage Vcpb can be changed in a similar manner as a voltage applied to word line WL to render the voltage stress acceleration condition for a gate insulating film of access transistor MT the same as the voltage stress acceleration condition for memory capacitor MQ. Reliabilities of access transistor MT and capacitor MQ are evaluated simultaneously under a same acceleration condition resulting in reduction of the time required for reliability evaluation testing through stress acceleration such as burn-in due to no need for separate reliability testings therefor.

Figure 15:
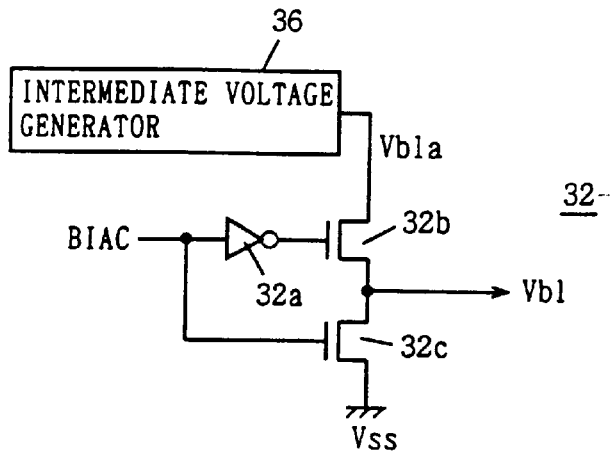

FIG. 15 shows one example of the configuration of switching circuit 32. In FIG. 15, switching circuit 32 includes an inverter circuit 32a which inverts stress acceleration mode designation signal BIAC, an n channel MOS transistor 32b which is turned on, when an output signal from inverter circuit 32a attains an H level, to output intermediate voltage Vb1a from an intermediate voltage generation circuit 36 as bit line precharging voltage Vbc1, and an n channel MOS transistor 32c which is turned on, when stress acceleration mode designation signal BIAC attains an active H level, to transfer ground voltage Vss (GND) as bit line precharging voltage Vb1.

Intermediate voltage generation circuit 36 outputs intermediate voltage Vb1a the voltage level of which is intermediate between power supply voltage Vcc and the ground voltage Vss (GND). The output signal from inverter circuit 32a changes between the level of the ground voltage and the level of the power supply voltage. In an operation in the stress acceleration mode when stress acceleration mode designation signal BIAC attains an H level, MOS transistor 32b is turned off, MOS transistor 32c is turned on, and ground voltage Vss is selected as bit line precharging voltage Vb1.

During a normal operation mode cycle when stress acceleration mode designation signal BIAC attains an L level, the output signal from inverter circuit 32a attains an H level of the power supply voltage level, MOS transistor 32b is turned on, and intermediate voltage Vb1a from intermediate voltage generation circuit 36 is transferred as bit line precharging voltage Vb1.

Figure 16:
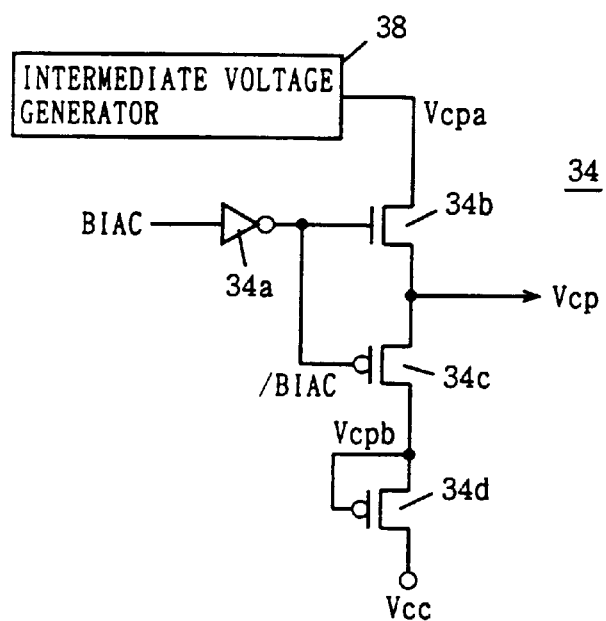
FIG. 16 schematically shows a configuration of the cell plate voltage switching circuit shown in FIG. 13.

FIG. 16 schematically shows one example of the configuration of switching circuit 34 shown in FIG. 13. In FIG. 16, switching circuit 34 includes an inverter circuit 34a which inverts stress acceleration mode designation signal BIAC to generate an inverted stress acceleration mode designation signal /BIAC, an n channel MOS transistor 34b which is turned on to transfer intermediate voltage Vcpa from an intermediate voltage generation circuit 38 as cell plate voltage Vcp when an output signal from inverter circuit 34a attains an H level, a p channel MOS transistor 34d which decreases power supply voltage Vcc by an absolute value Vthp of the threshold voltage thereof and then transfers the decreased power supply voltage, and a p channel MOS transistor 34c which is turned on to output Vcpb transferred from MOS transistor 34d as cell plate voltage Vcp when inverted stress acceleration mode designation signal /BIAC from inverter circuit 34a attains an L level.

During a normal operation mode cycle, stress acceleration mode designation signal BIAC attains an L level, the output signal from inverter circuit 34a attains an H level of the power supply voltage Vcc level, MOS transistor 34b is turned on, and MOS transistor 34c is turned off. Thus, in this state, intermediate voltage Vcpa from intermediate voltage generation circuit 38 is output as cell plate voltage Vcp. In an operation in the stress acceleration mode, the output signal from inverter circuit 34a attains an L level of the ground voltage level, MOS transistor 34b is turned off, MOS transistor 34c is turned on, and voltage Vcpb from MOS transistor 34d is output as cell plate voltage Vcp. In the stress acceleration mode, a voltage at a voltage level higher than intermediate voltage Vcpa can be used as cell plate voltage Vcp to accelerate the voltage stress applied to a dielectric film of a memory cell capacitor and to carry out faster stress acceleration testing of the memory cell capacitor.

Furthermore, when the voltage level of word line WL is increased and the voltage stress is accelerated, the stress on a gate insulating film of access transistor MT and the voltage stress on the memory cell capacitor can be simultaneously accelerated. The voltage level of voltage Vcpb, which is Vcc minus Vthp, is higher than the intermediate voltage level and the voltage stress to the dielectric film of the memory cell capacitor can be accelerated.

Figure 17:
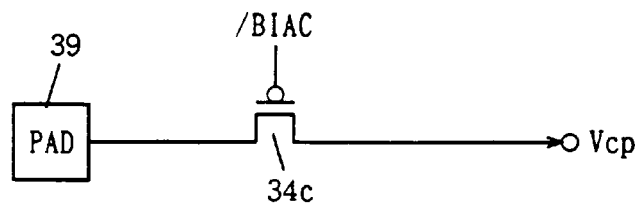
FIG. 17 schematically shows a configuration of a modification of the cell plate voltage switch circuit shown in FIG. 16.

FIG. 17 shows the configuration of a modification of the switching circuit shown in FIG. 16. FIG. 17 shows only MOS transistor 34c of switching circuit 34. The rest of the configuration is similar to that shown in FIG. 16. In FIG. 17, MOS transistor 34c, coupled with a pad 39, is turned on when stress acceleration mode designation signal /BIAC attains an active L level, and outputs a voltage applied to pad 39 as cell plate voltage Vcp. Pad 39 need only be an empty pad in the stress acceleration mode and need not be a dedicated pad, and may be a pad used in the normal cycle as is in the configuration shown in FIG. 6, for example.

With the configuration shown in FIG. 17, cell plate voltage Vcp can be externally controlled in the stress acceleration mode. Therefore, in selecting a word line, voltage stress acceleration for a gate insulating film of an access transistor and that for a dielectric film of a memory cell capacitor can be performed under the same condition with each other, reliability of the gate insulating film of the access transistor and reliability of the dielectric film of the memory cell capacitor can be evaluated under the same acceleration condition, the evaluations can be performed in parallel, and the time required for stress acceleration testing can be reduced.

According to the second embodiment of the present invention, in accelerating a voltage applied to a word line, a bit line equalizing circuit is rendered active, each bit line is held at a ground voltage level via the bit line equalization circuit, sense amplifier operation is also stopped, and the level of the cell plate voltage of the memory cell capacitor is changed. Thus, the voltage stress acceleration for a gate insulating film of an access transistor of a memory cell can be performed in parallel with the voltage stress acceleration for a dielectric film of the memory cell capacitor, and this allows parallel reliability evaluation of the gate insulating film of the access transistor and the dielectric film of the memory cell capacitor, resulting in reduction of the time required for stress acceleration testing for reliability evaluation. Furthermore, even only voltage stress acceleration of the dielectric film of the memory cell capacitor the testing time period thereof can be reduced.

[Third Embodiment]

Figure 18:
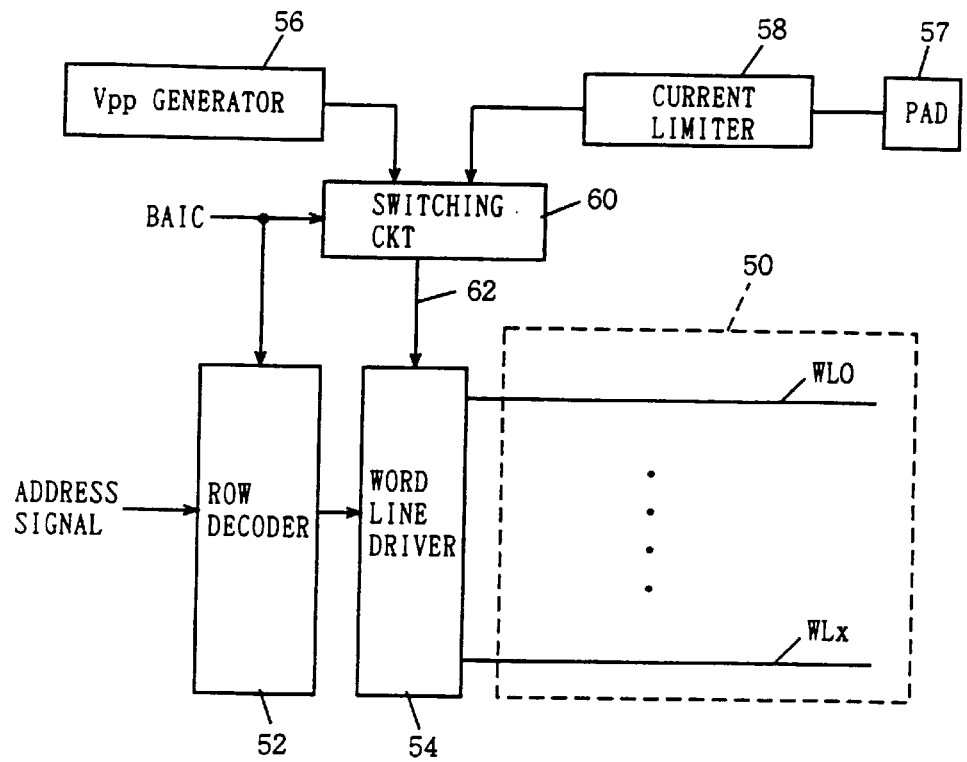
FIG. 18 schematically shows a structure of a main portion of a semiconductor memory device according to a third embodiment of the present invention.

FIG. 18 schematically shows a configuration of a main portion of a semiconductor memory device according to a third embodiment of the present invention. In FIG. 18, the semiconductor memory device includes a memory cell array 50 having a plurality of memory cells arranged in a matrix. In FIG. 18, only word lines WL0–WLx arranged corresponding to rows of memory cells are shown in memory cell array 50.

The semiconductor memory device also includes a row decoder 52 which decodes an applied address signal to generate a signal for selecting a word line corresponding to an addressed row in memory cell array 50, a word line driver 54 which drives a corresponding word line to selected state in response to a word line selecting signal from row decoder 52, a Vpp generation circuit 56 which generates a word line driving boosted voltage Vpp transferred onto the selected word line in a normal operation, a pad 57 which receives an externally applied word line driving voltage in the stress acceleration mode, a current limiter circuit 58 which limits the amount of current flowing from pad 57 to word line driver 54, and a switching circuit 60 which switches a path between current transfer paths from Vpp generation circuit 56 and from current limiter circuit 58 in response to stress acceleration mode designation signal BIAC. A high voltage power supply line 62 from switching circuit 60 is coupled with word line driver 54.

When stress acceleration mode designation signal BIAC is activated, row decoder 52 designates a plurality (for example, all) of word lines in memory cell array 50 as being selected. When stress acceleration mode designation signal BIAC is activated, switching circuit 60 selects a voltage from voltage limiter circuit 58 and transfers the voltage to high voltage power supply line 62. In the stress acceleration mode of operation, word line driver 54 drives, for example, all of word lines in memory cell array 50 to selected state in response to a word line selecting signal from row decoder 52. Large current is consumed when all word lines WL0–WLx are driven into selected state. Current limiter circuit 58, however, limits the amount of current transferred to the selected word lines, and large current flowing into high voltage power supply line 62 can be prevented and hence high voltage power supply line 62 can be prevented from being distructed.

As for the construction of row decoder 52, merely a structure can be employed in which input address signals or all output word line selecting signals are brought into selected state according to activation of stress acceleration mode designation signal BIAC.

Switching circuit 60 may be similar in configuration to switching circuit 14 shown in FIG. 5. If a semiconductor chip on which the semiconductor memory device is formed has not been cut away from a wafer, a specific pad can be provided as pad 57 and a stress can be directly applied to the specific pad using a probe from a tester. After the semiconductor chip on which the semiconductor memory device is formed is separated from the wafer and then packaged, a word line driving voltage is externally applied to pad 57 via a specific pin terminal. This configuration may be such as shown in FIG. 6 and a specific external pin terminal which is used in the normal mode of operation and is not used in the stress acceleration mode, is used as a word line driving high voltage applying terminal. The pin terminal may be a terminal which receives output enable signal /OE, for example. Furthermore, where word lines are all selected, address signals are all degenerated and thus a specific address signal pin terminal may be used as a word line driving voltage applying pin terminal.

Vpp generation circuit 56 which generates high voltage Vpp is a typical circuit which utilizes charge pumping operation of a capacitor.

Figure 19:
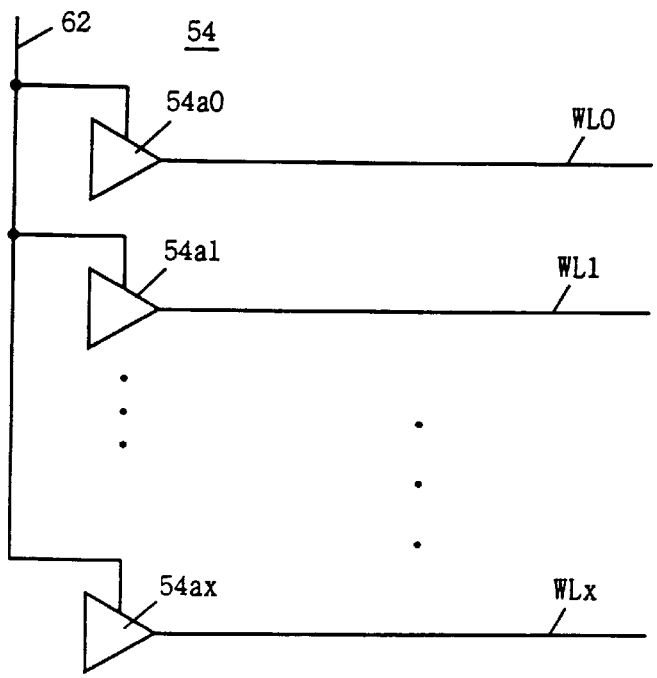
FIG. 19 schematically shows a structure of the word line driver shown in FIG. 18.

FIG. 19 schematically shows a configuration of word line driver 54. In FIG. 19, word line driver 54 includes word line drive circuits 54a0–54ax provided corresponding to word lines WL0–WLx, respectively. A power supply nodes of word line drive circuits 54a0–54ax is coupled with high voltage power supply line 62 and receives a boosted voltage for driving a word line via switching circuit 60 (see FIG. 18).

When word lines WL0–WLx are all driven to selected state in the stress acceleration mode to reduce the time required for stress acceleration testing, word line drive circuits 54a0–54ax are all activated and supply current from high voltage power supply line 62 to corresponding word lines WL0–WLx. Meanwhile, current limiter circuit 58 limits the amount of current flowing to high voltage supply line 62, and thus large current is prevented from flowing to high voltage supply line 62 when word lines drive circuits 54a0–54ax are all operated and word lines WL0–WLx are driven to selected state. The delay of the rise time of word lines WL0–WLx due to the current limitation is not significant, since stress acceleration testing does not require fast access.

Figure 20:
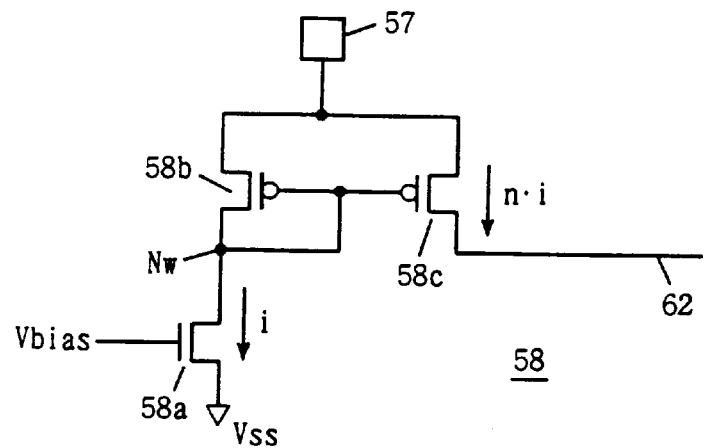
FIG. 20 shows one example of the structure of the current limiter circuit shown in FIG. 18.

FIG. 20 shows one example of the configuration of current limiter circuit 58 shown in FIG. 18. In FIG. 20, current limiter circuit 58 includes an n channel MOS transistor 58a which is connected between a node Nw and a ground node and receives a predetermined bias voltage Vbias at its gate to act as a constant current source, a p channel MOS transistor 58b which is connected between pad 57 and constant current source transistor 58a and has its gate connected to node Nw, and a p channel MOS transistor 58c which is coupled between pad 57 and high voltage power supply line 62 and has its gate connected to node Nw.

The size (the ratio of the channel width to the channel length; W/L) of MOS transistor 58c is set at n times that of MOS transistor 58b. MOS transistors 58b and 58c form a current mirror circuit which supplies n times the amount of current i supplied by constant current source transistor 58a onto high voltage power supply line 62. More specifically, MOS transistor 58b supplies current i to MOS transistor 58a, MOS transistor 58b acts as the master stage of the current mirror circuit, MOS transistor 58c acts as the slave stage of the current mirror circuit, and MOS transistor 58c supplies current the magnitude of which is n times that of current i flowing through MOS transistor 58b to high voltage supply line 62b.

The configuration of current limiter circuit 58 with a constant current supply and a current mirror circuit shown in FIG. 20 allows the amount of current flowing onto high voltage power supply line 62 to be set accurately. Furthermore, pad 57 receives high voltage only in the stress acceleration mode and does not receive high voltage in the normal mode of operation other than the stress acceleration mode (pad 57 is disconnected from the current limiter circuit during a normal operation cycle, as shown in FIG. 6). Thus, current limiter circuit 58 can supply required current only in the stress acceleration mode.

[First Modification]

Figure 21:
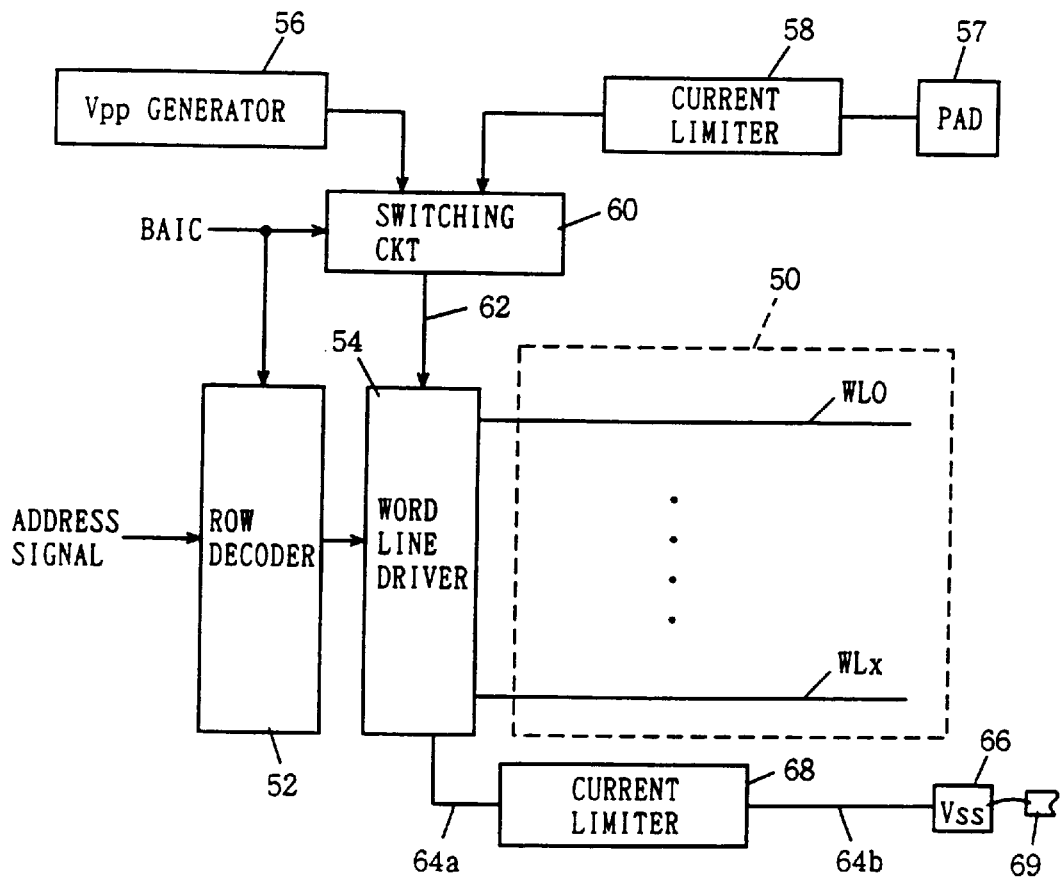
FIG. 21 schematically shows a structure of the first modification of the semiconductor memory device according to the third embodiment of the present invention.

FIG. 21 schematically shows a configuration of a first modification of the semiconductor memory device according to the third embodiment of the present invention. The configuration of the semiconductor memory device shown in FIG. 21 is the combination of the configuration shown in FIG. 18 and an additional current limiter circuit 68 provided between a ground line 64a for word line driver 54 and a ground line 64b connected to a ground pad 66. Ground pad 66 is connected to an external ground pin terminal 69.

When all of word lines WL0–WLx are driven into selected state and the word lines are all driven simultaneously to non-selected state in the stress acceleration mode, large discharging current from the selected word lines WL0–WLx flows from word line driver 54 to ground line 64a. Current limiter circuit 68 is provided for preventing destruction of ground lines 64a and 64b due to the discharging current. This limits the amount of discharging current from word line driver 54 to the ground lines and thus prevents destruction of the ground lines due to large current when the word lines are shifted to non-selected state.

Figure 22:
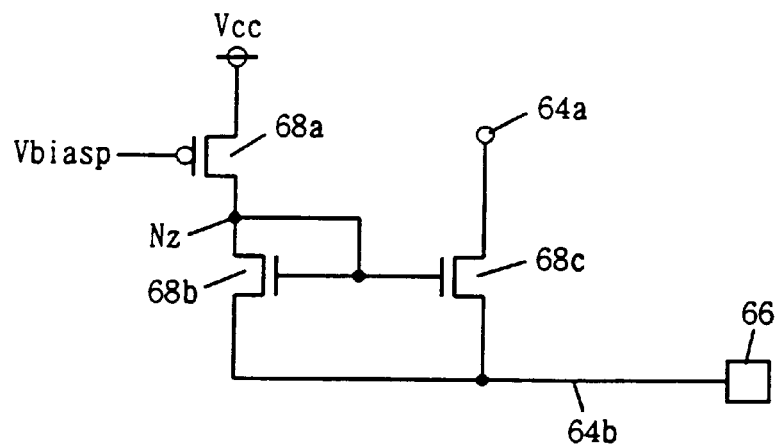
FIG. 22 shows one example of the structure of the current limiter circuit for the grounding lines shown in FIG. 21.

FIG. 22 schematically shows one example of the configuration of current limiter circuit 68 shown in FIG. 21. In FIG. 22, current limiter circuit 68 includes a p channel MOS transistor 68a which is connected between a power supply node and an internal node Nz and receives a bias voltage Vbiasp at its gate, an n channel MOS transistor 68b which is connected between internal node Nz and ground line 64b and has its gate connected to internal node Nz, and an n channel MOS transistor 68c which is connected between ground lines 64a and 64b and has its gate connected to internal node Nz. A ground line 64b is connected to ground pad 66.

MOS transistor 68a acts as a constant current source to supply a constant current. MOS transistors 68b and 68c form a current mirror circuit. By setting the mirror ratio (the size ratio) of MOS transistor 68b to MOS transistor 68c at an appropriate value, the mirror current of the current flowing via MOS transistors 68a and 68b flows via MOS transistor 68c. Thus, when the size (the ratio of the channel width to the channel length) of MOS transistor 68c is set at, for example, n times that of MOS transistor 68b, a current n times as large as the current flowing via MOS transistors 68a and 68b flows via MOS transistor 68c, as in the configuration shown in FIG. 20. Thus, MOS transistor 68c can prevent large current from flowing onto ground lines 64a and 64b when selected word lines are shifted to non-selected state.

Since current is limited using a current mirror circuit, as shown in FIGS. 20 and 22, an MOS transistor which receives a bias voltage can be sufficiently small in size, the bias voltage generation circuit is not required to drive large gate capacitance, and thus a bias voltage generation circuit with small driving capability can be used. Furthermore, in the configuration shown in FIG. 22, bias voltage Vbiasp need only be a bias voltage which changes according to power supply voltage Vcc in the stress acceleration mode and supply a constant current in operations in the normal and stress acceleration modes (Vcc-Vbiasp=constant).

[Second Modification]

Figure 23:
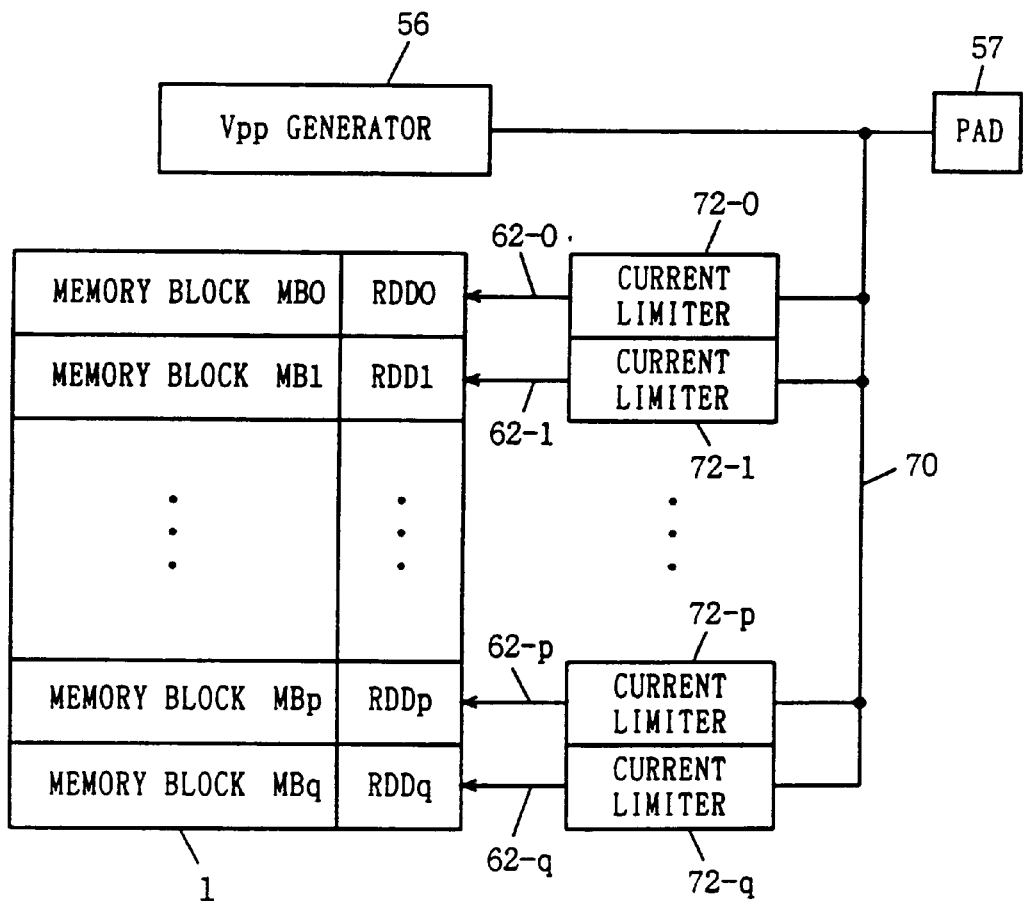
FIG. 23 schematically shows a structure of a second modification of the semiconductor memory device according to the third embodiment of the present invention.

FIG. 23 schematically shows a configuration of a second modification of the semiconductor memory device according to the third embodiment of the present invention. In FIG. 23, memory array 1 is divided into a plurality of memory blocks MB0–MBq. Row decoders/drivers RDD0–RDDq are arranged for memory blocks MB0–MBq, respectively. Each of row decoders/drivers RDD0–RDDq has both a row decoder and an word line driver and drives a word line included in a corresponding memory block to selected state in response to an address signal.

Current limiter circuits 72-0–72-q are provided for row decoders/drivers RDD0–RDDq, respectively. Current limiter circuits 72-0–72-q each have a configuration similar to that shown in FIG. 20 and they transfer high voltage Vpp to corresponding row decoders/drivers RDD0–RDDq via high voltage sub-power supply lines 62-0–62-q, respectively.

Current limiter circuits 72-0–72-q are commonly coupled with a high voltage power supply line 70. High voltage power supply line 70 selectively receives a high voltage from Vpp generation circuit 56 and pad 57. Vpp generation circuit 56 and pad 57 are the same as those in shown in FIG. 21.

Current limiter circuits are dispersedly arranged in the configuration shown in FIG. 23. Since the dispersed arrangement of current limiter circuits 72-0–72-q allows the current limiting portions to be arranged dispersedly, large local current can be prevented and effective current limitation can be achieved.

In the arrangement shown in FIG. 23, current limiter circuits 72-0–72-q need not be provided one for each of row decoders/drivers RDD0–RDDq provided for memory blocks MB0–MBq, respectively. Row decoders/drivers RDD0–RDDq may be appropriately grouped so that each group is provided with a current limiter circuit.

Furthermore, the configuration shown in FIG. 23 may be also provided with dispersedly arranged current limiter circuits for limiting current flowing to the ground lines. According to the third embodiment of the present invention, a power source line which supplies a voltage applied to a word line is provided with a current limiter circuit. Thus, when all word lines are driven into selected state and into deselected state in the stress acceleration mode, large current flow can be prevented and reliability of the device is ensured.

[Fourth Embodiment]

Figure 24:
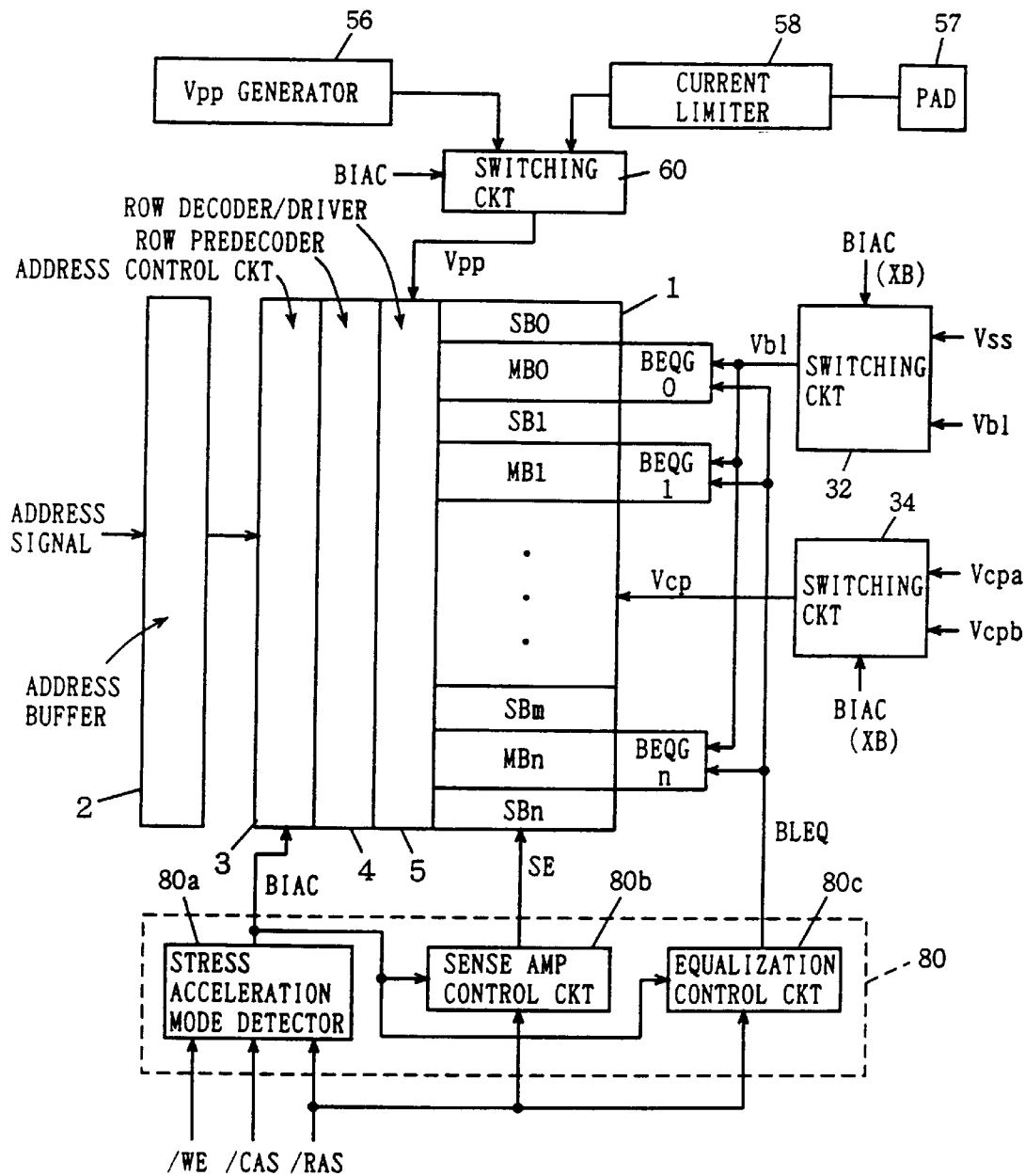
FIG. 24 schematically shows an entire structure of a semiconductor memory device according to a fourth embodiment of the present invention.

FIG. 24 schematically shows the entire configuration of a semiconductor memory device according to a fourth embodiment of the present invention. In FIG. 24, the semiconductor memory device according to the fourth embodiment of the present invention includes memory array 1 divided into a plurality of memory blocks MB0–MBn. Each of memory blocks MB0–MBn has a plurality of memory cells arranged in a matrix. Sense amplifier bands SB0–SBm are provided for memory blocks MB0–MBn, respectively. Sense amplifier bands SB1–SBm are shared between memory blocks arranged at their respective both sides. Groups BEQG0–BEQGn of bit line equalizer circuits for precharging the potential of each pair of bit lines at a predetermined potential are provided for memory blocks MB0–MBn, respectively.

The semiconductor memory device also includes an address buffer 2 which receives an external address signal to generate an internal address signal, an address control circuit 3 which performs address conversion to specify a plurality of rows in the stress acceleration mode on an internal address signal applied from the address buffer, a row predecoder 4 which predecodes an internal row address signal applied from address control circuit 3, and a row decoder/driver 5 which drives a specified word line of memory blocks MB0–MBn to selected state in response to a predecoded signal output from row predecoder 4.

Address buffer 2, address control circuit 3, row predecoder 4 and row decoder/driver 5 are the same in configuration to those shown in FIG. 1, and address control circuit 3 so performs address conversion that more word lines are driven into selected state than during a normal operation cycle when stress acceleration mode designation signal BIAC is activated.

The semiconductor memory device also includes Vpp generation circuit 6 which generates a boosted voltage to be transferred onto a selected word line, current limiter circuit 58 which transfers voltage applied to pad 57 by limiting the current flowing therethrough, and switching circuit 60 which transfers one of voltages applied from Vpp generation circuit 56 and current limiter circuit 58 to a word line driving portion of row decoder/driver 5 in response to the stress acceleration mode designation signal. When stress acceleration mode designation signal BIAC is activated and the stress acceleration mode is designated, switching circuit 60 selects the voltage applied via current limiter circuit 58.

The semiconductor memory device further includes switching circuit 32 which selects one of ground voltage Vss and precharging voltage Vb1 at an intermediate voltage level in response to stress acceleration mode designation signal BIAC and transfers the selected voltage to bit line equalizer circuit groups BEQG0–BEQGn, and switching circuit 34 which selects one of cell plate voltage Vcpa at the intermediate voltage level and cell plate voltage Vcpb externally applied in the stress acceleration mode in response to stress acceleration mode designation signal BIAC to generate cell plate voltage Vcp and transfers cell plate voltage Vcp to a cell plate electrode of a memory cell capacitor. Switching circuit 32 selects ground voltage Vss in the stress acceleration mode and selects intermediate voltage Vb1 during a normal operation cycle. Switching circuit 34 selects intermediate voltage Vcpa in the stress acceleration mode and selects externally controllable voltage Vcpb in the stress acceleration mode.

To control an internal operation of the semiconductor memory device, a control clock generation circuit 80 is provided which generates internal control signals in response to row address strobe signal /RAS, column address strobe signal /CAS and write enable signal /WE. Control clock generation circuit 80 includes a stress acceleration mode detector circuit 80a which detects that the stress acceleration mode is designated in response to row address strobe signal /RAS, column address strobe signal /CAS and write enable signal /WE and outputs stress acceleration mode designation signal BIAC, a sense amplifier control circuit 80b which outputs sense amplifier activating signal SE in response to row address strobe signal /RAS and stress acceleration mode designation signal BIAC, and an equalization control circuit 80c which outputs bit line equalization designating signal BLEQ in response to row address strobe signal /RAS and stress acceleration mode designation signal BIAC.

When stress acceleration mode designation signal BIAC is activated, sense amplifier control circuit 80b holds sense amplifier activating signal SE inactive independently of the state of row address strobe signal /RAS. During a normal operation cycle, sense amplifier control circuit 80b activates sense amplifier activating signal SE when a predetermined time period elapses after activation of row address strobe signal /RAS. When stress acceleration mode designation signal BIAC is activated, equalization control circuit 80c renders bit line equalization designating signal BLEQ normally active at H level. During a normal operation cycle when row address strobe signal /RAS is activated, equalization control circuit 80c inactivates bit line equalization designating signal BLEQ (only for a non-selected memory block).

The configuration of the semiconductor memory device shown in FIG. 24 is substantially a combination of the configurations of the first, second and third embodiments. A required number of word lines can be simultaneously driven to selected state in the stress acceleration mode. Switching circuit 60 transfers an external power supply voltage applied from pad 57 via current limiter circuit 58 to row decoder/driver 5 and the addressed word lines are driven to selected state. When many word lines are driven into selected state, current limiter circuit 58 limits the current flow and thus prevents destruction of interconnection line due to large current flow.

Meanwhile, ground voltage Vss and externally controllable voltage Vcpb are set as the bit line voltage and the cell plate voltage through switching circuits 32 and 34, respectively, and voltage stress acceleration for a gate insulating film of a memory transistor is performed in parallel with that for a dielectric film of a memory cell capacitor.

The configuration shown in FIG. 24 allows a semiconductor memory device which achieves all effects of the first, second and third embodiments.

It should be noted that in FIG. 24, switching circuits 32 and 34 may be provided for each of memory blocks MB0–MBn to switch the bit line voltage and the cell plate voltage in response to block predecoded signal XB from decoder 4 only for a selected memory block. Furthermore, equalization control circuit 80c inactivates bit line equalization designating signal BLEQ only for a selected memory block during a normal operation cycle, and this is readily implemented by using a memory block specifying signal from row predecoder 4. This also applies to sense amplifier activating signal SE from sense amplifier control circuit 80b, and a sense amplifier provided for a selected memory block is activated during a normal operation cycle.

In the configuration shown in FIG. 24, also, current limiter circuit 58 may be provided according to a dispersed arrangement, one for a predetermined number of memory blocks. Furthermore, a circuit for limiting a current through a ground line may be provided to reduce large current flow when a selected word line is discharged.

According to the fourth embodiment of the present invention, in the stress acceleration mode, a plurality of word lines are simultaneously selected, bit line voltage and cell plate voltage are changed, a sense amplifier is inactivated, and word line driving current is limited. Thus, the plurality of word lines can be simultaneously driven to selected state stably, stress acceleration for a gate insulating film of a memory cell transistor can be performed simultaneously with that for a dielectric film of a memory cell capacitor, and the time required for stress acceleration testing can be significantly reduced.

[Another Application]

While a dynamic semiconductor memory device is described as the semiconductor memory devices in the above embodiments, the simultaneous driving of word lines to selected state is applicable to a static semiconductor memory device (SRAM).

Furthermore, a stress acceleration testing may be a life time testing other than burn-in testing carried out before shipping products, and need only be a testing in which high voltage is applied to accelerate voltage stress.

According to the present invention, current for driving a selected word line in the stress acceleration mode is reduced and a stress acceleration testing can be accurately carried out in a short period of time without degrading reliability of components.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory cells arranged in a matrix of rows and columns;

a plurality of word lines arranged corresponding to said rows and connected to memory cells of corresponding rows;

a driving power supply node receiving a word line driving voltage applied in a stress acceleration mode of operation;

word line selecting means for simultaneously selecting a predetermined number of word lines of said plurality of word lines in accordance with an applied address signal in said stress acceleration mode of operation and transferring the voltage from said driving power supply node onto the selected word lines, said predetermined number being at least two; and current limiting means connected between said driving power supply node and said word line selecting means for limiting an amount of current flowing between said driving power supply node and said word line selecting means; wherein said matrix is divided into blocks of rows, and said word line selecting means is divided into blocks corresponding to said blocks of rows, and said current limiting means includes a plurality of current limiting circuits, each coupled to the driving power supply node and provided for a predetermined number of blocks of said word line selecting means.

2. The semiconductor memory device according to claim 1, wherein said word line selecting means is divided into a plurality of blocks corresponding to the blocks of rows of said matrix, and said plurality of current limiting circuits are coupled between each of said blocks of said word line selecting means and said driving power supply node.

3. The semiconductor memory device according to claim 1, wherein said current limiting means includes:

a constant current source, and a current mirror stage coupled between said driving power supply node and said constant current source and causing a mirror current of a current flowing through said constant current source between an output node thereof and said driving power supply node, said mirror current flowing between said driving power supply node and said word line selecting means.

4. The semiconductor memory device according to claim 1, further comprising:

a pad receiving a reference voltage to be transferred onto a non-selected word line through said row selection means, and another current limiting means coupled between said word line selecting means and said pad for limiting an amount of current flowing between said row selection means and said pad in the stress acceleration mode of operation.

* * * * *